(12) United States Patent
Otsuka et al.

(10) Patent No.: US 11,495,663 B2
(45) Date of Patent: Nov. 8, 2022

(54) SEMICONDUCTOR DEVICE INCLUDING INSULATED GATE BIPOLAR TRANSISTOR, DIODE, AND CURRENT SENSE REGIONS

(71) Applicant: Mitsubishi Electric Corporation, Tokyo (JP)

(72) Inventors: Kakeru Otsuka, Tokyo (JP); Hirofumi Oki, Tokyo (JP); Kohei Sako, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/201,109

(22) Filed: Mar. 15, 2021

(65) Prior Publication Data
US 2022/0013636 A1 Jan. 13, 2022

(30) Foreign Application Priority Data
Jul. 7, 2020 (JP) .............................. JP2020-116826

(51) Int. Cl.
*H01L 29/739* (2006.01)
*H01L 29/10* (2006.01)
*H01L 29/66* (2006.01)
*H01L 29/78* (2006.01)

(52) U.S. Cl.
CPC .... *H01L 29/1095* (2013.01); *H01L 29/66325* (2013.01); *H01L 29/7393* (2013.01); *H01L 29/7803* (2013.01)

(58) Field of Classification Search
CPC ... H01L 29/0834; H01L 29/7803–7808; H01L 27/0255; H01L 27/0727
See application file for complete search history.

(56) References Cited

U.S. PATENT DOCUMENTS

| 8,471,291 B2 | 6/2013 | Soeno | |
| 2005/0017290 A1* | 1/2005 | Takahashi | H01L 29/0696 257/E29.198 |
| 2013/0009206 A1* | 1/2013 | Soeno | H01L 29/1095 257/140 |
| 2016/0372584 A1* | 12/2016 | Kimura | H01L 29/0649 |

FOREIGN PATENT DOCUMENTS

JP 5067517 B2 11/2012

* cited by examiner

*Primary Examiner* — Eric A. Ward
(74) *Attorney, Agent, or Firm* — Studebaker & Brackett PC

(57) ABSTRACT

A predetermined relational expression holds where a first distance along the in-plane direction from a channel of the first semiconductor layer to a third semiconductor layer that is the other of the collector layer and the cathode layer is designated as W, a second distance from the channel of the first semiconductor layer to the second semiconductor layer is designated as S, and a diffusion coefficient and a lifetime of a part of the semiconductor substrate between the channel of the first semiconductor layer and the third semiconductor layer are designated as D and τ, respectively.

4 Claims, 19 Drawing Sheets

F I G. 7
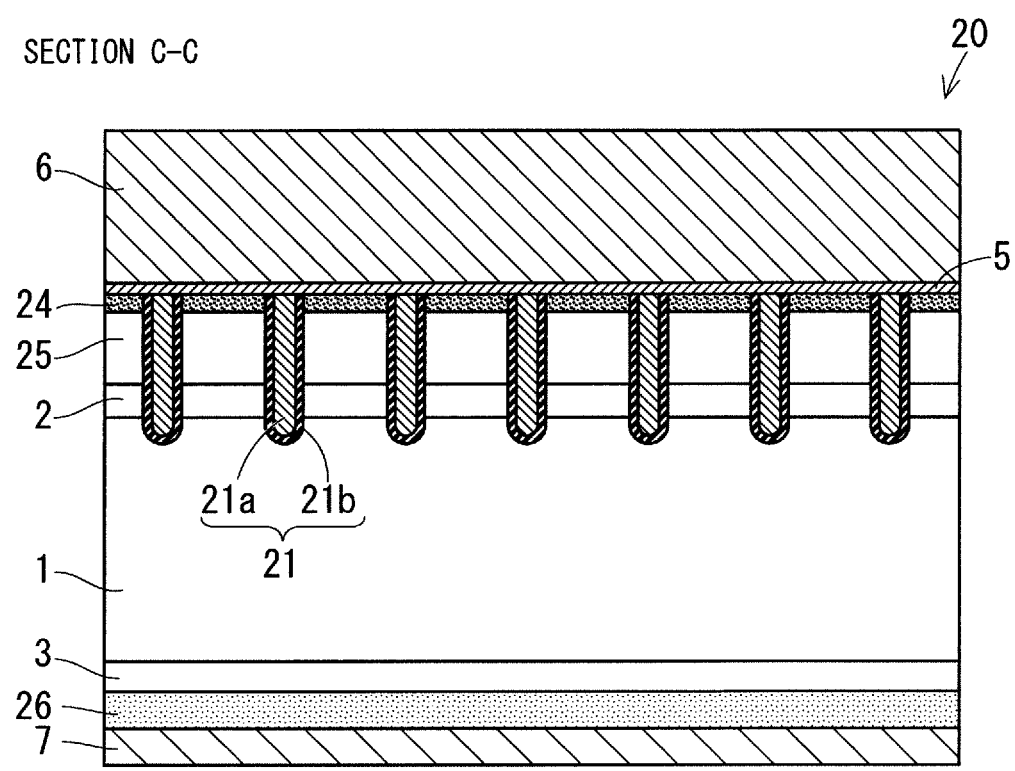

F I G. 1 2
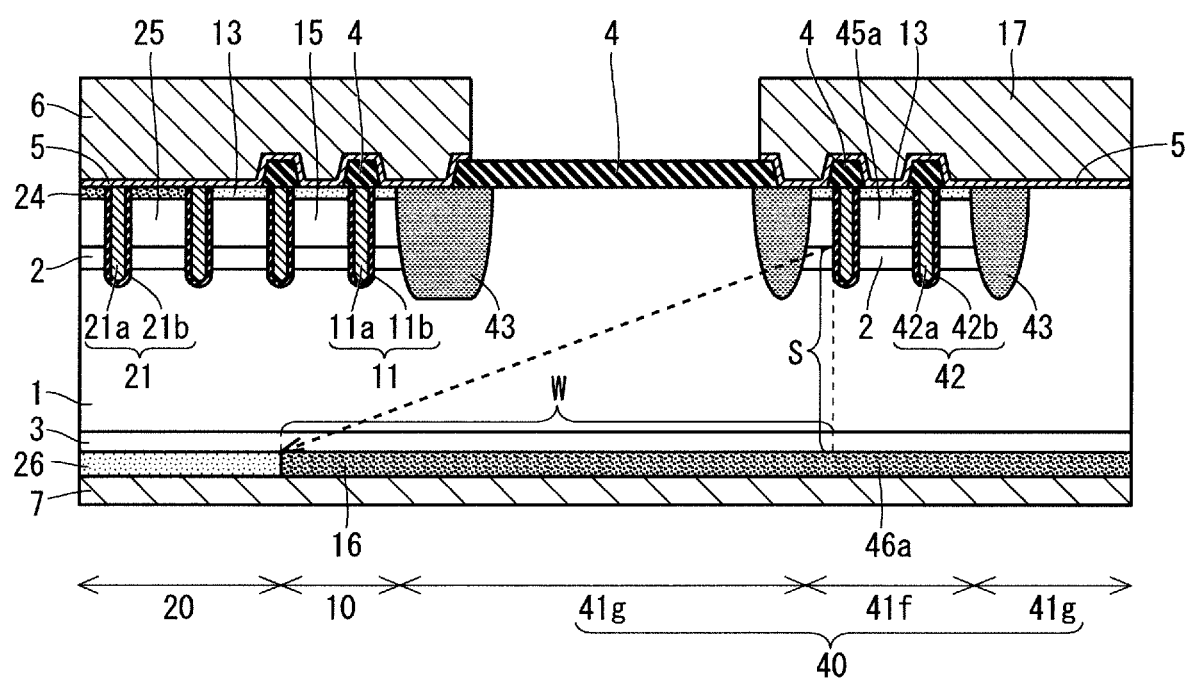

F I G. 1 9
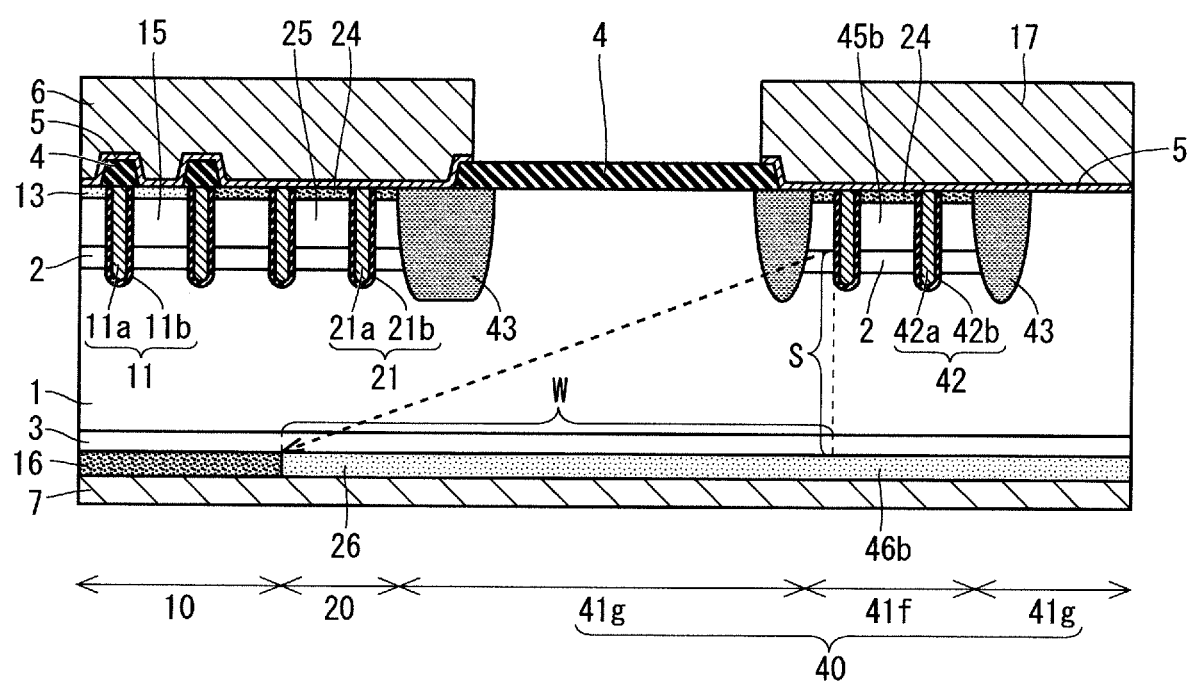

SEMICONDUCTOR DEVICE INCLUDING INSULATED GATE BIPOLAR TRANSISTOR, DIODE, AND CURRENT SENSE REGIONS

BACKGROUND OF THE INVENTION

Field of the Invention

The present disclosure relates to a semiconductor device.

Description of the Background Art

In recent years, it has been proposed to use a reverse conducting insulated gate bipolar transistor (RC-IGBT for short) for, for example, home appliances, electric vehicles, railways, photovoltaic power generation, wind power generation.

The RC-IGBT includes an IGBT and a diode such as a freewheeling diode (FWD) that are provided on one semiconductor substrate. Various techniques have been proposed for this kind of RC-IGBT. For example, Japanese Patent No. 5067517 proposes a technique in an RC-IGBT that separates a current sense and a cathode layer in a diode region to prevent them from interfering with each other.

It is considered that a distance between the current sense and the cathode layer has a lower limit that can prevent the current sense and the cathode layer from interfering with each other, and that the lower limit depends on a thickness of the semiconductor substrate in practice. Unfortunately, in conventional techniques, the distance may be relatively large because a distance in a thickness direction of the semiconductor substrate is not considered.

SUMMARY

The present disclosure is made in view of the above-mentioned problem, and an object thereof is to provide a technique that can reduce a distance between a channel in a current sense region and a cathode layer as much as possible while preventing the channel and the cathode layer from interfering with each other.

A semiconductor device according to the present disclosure includes a semiconductor substrate having a first main surface and a second main surface opposite to the first main surface, an IGBT region, a diode region, and a current sense region being provided along an in-plane direction in the semiconductor substrate. The semiconductor substrate includes a base layer provided on a first main surface side being a side of the first main surface, in the IGBT region, a collector layer provided on a second main surface side being a side of the second main surface, in the IGBT region, an anode layer provided on the first main surface side in the diode region, a cathode layer provided on the second main surface side in the diode region and adjacent to the collector layer in the in-plane direction, a first semiconductor layer provided on the first main surface side in the current sense region and corresponding to the base layer or the anode layer, and a second semiconductor layer provided on the second main surface side in the current sense region and corresponding to one of the collector layer and the cathode layer. A predetermined relational expression holds where a first distance along the in-plane direction from a channel of the first semiconductor layer to a third semiconductor layer that is the other of the collector layer and the cathode layer is designated as W, a second distance from the channel of the first semiconductor layer to the second semiconductor layer is designated as S, and a diffusion coefficient and a lifetime of a part of the semiconductor substrate between the channel of the first semiconductor layer and the third semiconductor layer are designated as D and τ, respectively.

A distance between the channel in the current sense region and the cathode layer can be reduced as much as possible while the channel and the cathode layer are prevented from interfering with each other.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 7 and 8 are each a sectional view illustrating a structure of the diode region of the semiconductor device according to the first preferred embodiment;

FIG. 12 is a sectional view illustrating a structure of a pad region of the semiconductor device according to the first preferred embodiment;

FIG. 19 is a sectional view illustrating a structure of a pad region of a semiconductor device according to a second preferred embodiment.

DESCRIPTION OF THE PREFERRED EMBODIMENTS

Figure 1:
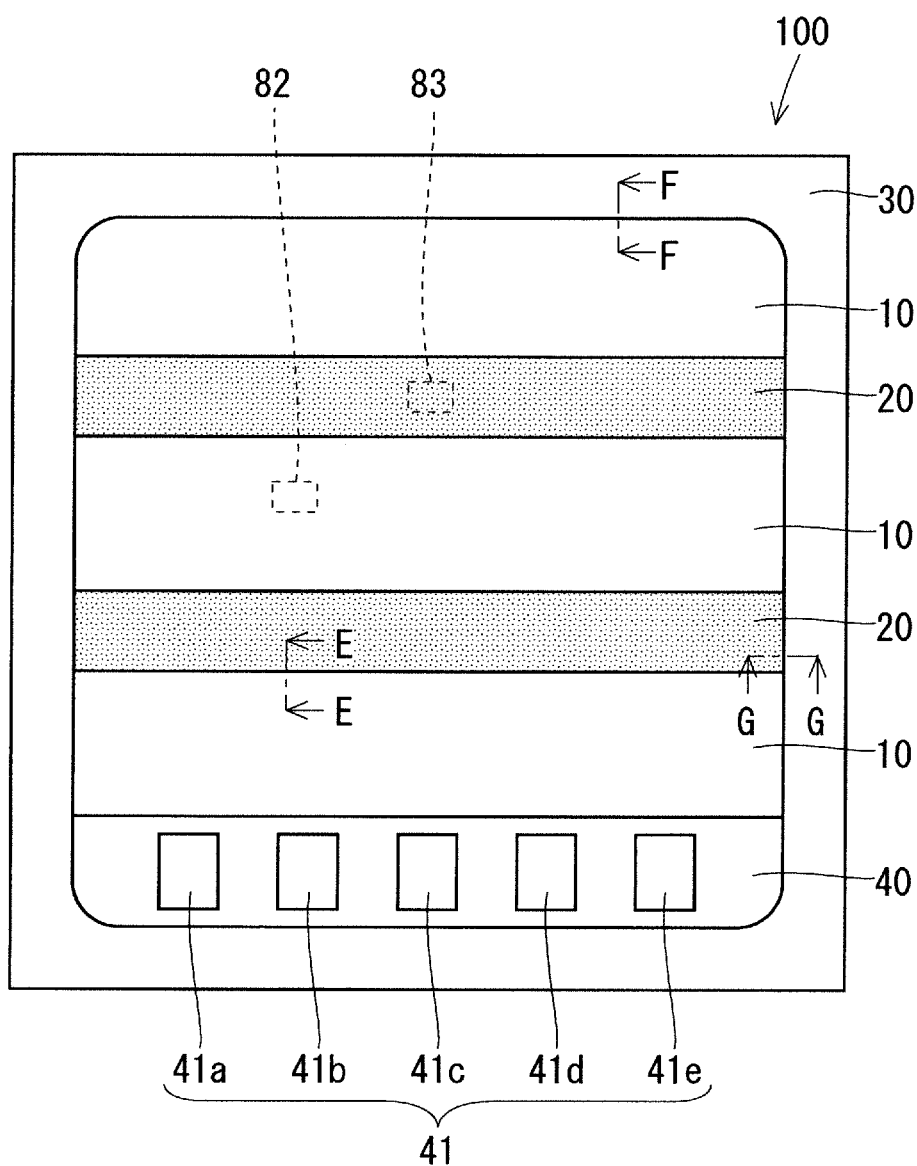
FIG. 1 is a plan view illustrating a structure of a semiconductor device according to a first preferred embodiment.

Hereinafter, preferred embodiments will be described with reference to the accompanying drawings. Features described in each of the following preferred embodiments are exemplary and all the features are not necessarily required. In the description shown below, similar components are designated by identical or similar reference numerals in the plurality of preferred embodiments, and different components will be mainly described. The description described below shows specific positions and directions such as "up", "down", "left", "right", "front", and "back" that are not necessarily identical to directions at the time of actual implementation. One part having a higher concentration than another part means that, for example, an average concentration of the one part is higher than an average concentration of the other part, or a maximum value of the concentration of the one part is higher than a maximum value of the concentration of the other part.

The following description shows n and p that each indicate a conductive type of a semiconductor. Although the present disclosure is described in which a first conductive type is designated as a n-type and a second conductive type is designated as a p-type, the first conductive type may be designated as the p-type, and the second conductive type may be designated as the n-type. An impurity concentration lower than n is indicated as n⁻, and an impurity concentration higher than n is indicated as n⁺. Similarly, an impurity concentration lower than p is indicated as p⁻, and an impurity concentration higher than p is indicated as p⁺.

First Preferred Embodiment

Figure 2:
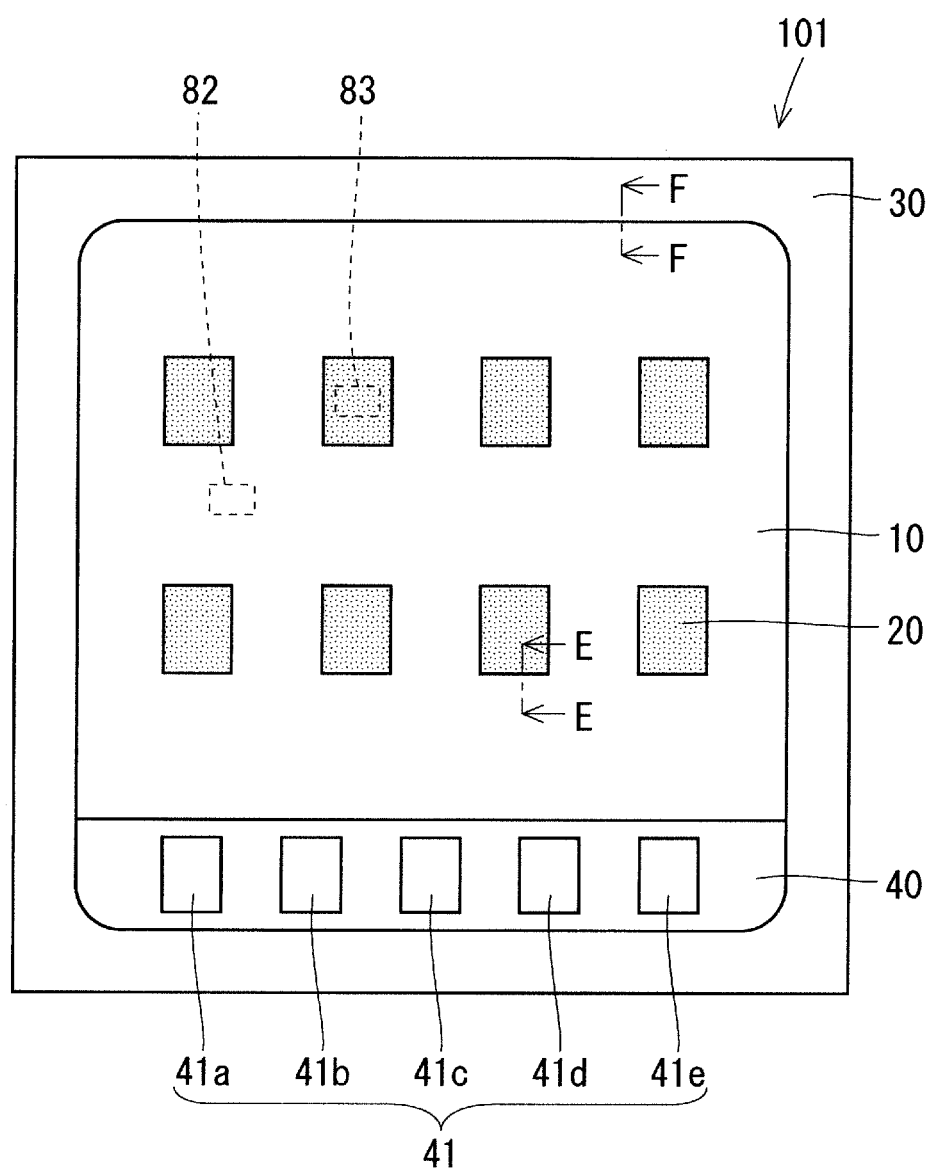
FIG. 2 is a plan view illustrating another structure of the semiconductor device according to the first preferred embodiment.

FIG. 1 is a plan view illustrating a structure of a semiconductor device that is an RC-IGBT according to a first preferred embodiment. FIG. 2 is a plan view illustrating another structure of the semiconductor device that is the RC-IGBT according to the first preferred embodiment. FIG. 1 illustrates a semiconductor device 100 that includes an IGBT region 10 and a diode region 20, being provided side by side in a stripe shape, and that may be simply referred to as a "strip type" in the following description. FIG. 2 illustrates a semiconductor device 101 that includes multiple diode regions 20 provided in a vertical direction and a horizontal direction, and an IGBT region 10 provided around the diode regions 20, and that may be simply referred to as an "island type" in the following description.

<Entire Plane Structure of Stripe Type>

In FIG. 1, the semiconductor device 100 includes the IGBT region 10 and the diode region 20 in one semiconductor device. Each of the IGBT region 10 and the diode region 20 extends from one end side to the other end side of the semiconductor device 100, and is provided alternately in a stripe shape in a direction orthogonal to an extending direction of each of the IGBT region 10 and the diode region 20. FIG. 1 illustrates three IGBT regions 10 and two diode regions 20, and a structure in which all the diode regions 20 are interposed between the corresponding IGBT regions 10. However, the number of the IGBT regions 10 and the diode regions 20 is not limited to this, the number of the IGBT regions 10 may be three or more, or three or less, and the number of the diode regions 20 may be two or more, or two or less. Locations of the IGBT regions 10 and the diode regions 20 in FIG. 1 may be exchanged, and all the IGBT regions 10 may be interposed between the corresponding diode regions 20. Additionally, the IGBT regions 10 and the diode regions 20 may be provided adjacent to each other one by one.

As illustrated in FIG. 1, a pad region 40 is provided adjacent to the IGBT region 10 on a lower side in the drawing. The pad region 40 is provided with a control pad 41 for controlling the semiconductor device 100. In the following description, the IGBT region 10 and the diode region 20 may be collectively referred to as a cell region. A terminal region 30 is provided around a region including the cell region and the pad region 40 to hold withstand voltage of the semiconductor device 100. The terminal region 30 may be appropriately provided with a well-known withstand voltage holding structure. The withstand voltage holding structure may be configured such that, for example, a field limiting ring (FLR) in which a cell region is surrounded by a p-type terminal well layer of a p-type semiconductor, or with a variation of lateral doping (VLD) in which a cell region is surrounded by a p-type well layer with a concentration gradient is provided on the first main surface side, i.e., front surface side of the semiconductor device 100. The number of p-type terminal well layers in the shape of a ring used for the FLR and concentration distribution used for the VLD may be appropriately selected depending on withstand voltage design of the semiconductor device 100.

The control pad 41 includes, for example, at least any one of a current sense pad 41a, a Kelvin emitter pad 41b, a gate pad 41c, and temperature sense diode pads 41d, 41e.

The current sense pad 41a is a control pad for detecting a current flowing through the cell region of the semiconductor device 100. The current sense pad 41a is electrically connected to the cell to allow a current to flow through the cell region of the semiconductor device 100 such that a current of a fraction to a fraction of tens of thousandths flowing through the entire cell region flows through a part of the IGBT cell or the diode cell in the cell region.

The Kelvin emitter pad 41b and the gate pad 41c are each a control pad to which gate drive voltage for on-off control of the semiconductor device 100 is applied. The Kelvin emitter pad 41b is electrically connected to a p-type base layer of the IGBT cell. The gate pad 41c is electrically connected to a gate trench electrode of the IGBT cell. The Kelvin emitter pad 41b and the p-type base layer may be electrically connected with a p⁺ type contact layer interposed therebetween.

The temperature sense diode pads 41d, 41e are control pads electrically connected to an anode and a cathode of the temperature sense diode provided in the semiconductor device 100. Voltage between the anode and cathode of the temperature sense diode (not illustrated) provided in the cell region is measured through the temperature sense diode pads 41d, 41e, and temperature of the semiconductor device 100 is measured based on the voltage.

<Entire Plane Structure of Island Type>

In FIG. 2, the semiconductor device 101 includes the IGBT region 10 and the diode region 20 in one semiconductor device. Multiple diode regions 20 are disposed side by side in each of the vertical direction and the horizontal direction in the semiconductor device 101, and the periphery of each of the diode regions 20 is surrounded by the IGBT region 10. That is, the multiple diode regions 20 are provided in an island shape in the IGBT region 10. FIG. 2 illustrates a structure in which the diode region 20 is provided in a matrix with four columns in a left-right direction in the drawing and two rows in the vertical direction in the drawing. However, the number and placement of the diode regions 20 are not limited to this. One or more diode regions 20 may be provided scattered in the IGBT region 10 as long as the periphery of each of the diode regions 20 is surrounded by the IGBT region 10.

As illustrated in FIG. 2, the pad region 40 is provided adjacent to a lower side of the IGBT region 10 in the drawing. The pad region 40 is a region in which the control pad 41 for controlling the semiconductor device 101 is provided. Even in the description here, the IGBT region 10 and the diode region 20 are collectively referred to as a cell region. The terminal region 30 is provided around a region including the cell region and the pad region 40 to hold withstand voltage of the semiconductor device 101. The terminal region 30 may be appropriately provided with a well-known withstand voltage holding structure. The withstand voltage holding structure may be configured such that, for example, a FLR in which a region including the cell region and the pad region 40 is surrounded by a p-type terminal well layer of a p-type semiconductor, or with a VLD in which the cell region is surrounded by a p-type well layer with a concentration gradient is provided on the first main surface side, i.e., front surface side of the semiconductor device 101. The number of p-type terminal well layers in the shape of a ring used for the FLR and concentration distribution used for the VLD may be appropriately selected depending on withstand voltage design of the semiconductor device 101.

The control pad 41 includes, for example, at least any one of a current sense pad 41a, a Kelvin emitter pad 41b, a gate pad 41c, and temperature sense diode pads 41d, 41e.

The current sense pad 41a is a control pad for detecting a current flowing through the cell region of the semiconductor device 101. The current sense pad 41a is electrically connected to the cell to allow a current to flow through the cell region of the semiconductor device 101 such that a current of a fraction to a fraction of tens of thousandths flowing through the entire cell region flows through a part of the IGBT cell or the diode cell in the cell region.

The Kelvin emitter pad 41b and the gate pad 41c are each a control pad to which gate drive voltage for on-off control of the semiconductor device 101 is applied. The Kelvin emitter pad 41b is electrically connected to a p-type base layer and an n$^+$-type source layer of the IGBT cell. The gate pad 41c is electrically connected to a gate trench electrode of the IGBT cell. The Kelvin emitter pad 41b and the p-type base layer may be electrically connected with a p$^+$ type contact layer interposed therebetween.

The temperature sense diode pads 41d, 41e are control pads electrically connected to an anode and a cathode of the temperature sense diode provided in the semiconductor device 101. Voltage between the anode and cathode of the temperature sense diode (not illustrated) provided in the cell region is measured through the temperature sense diode pads 41d, 41e, and temperature of the semiconductor device 101 is measured based on the voltage.

<IGBT Region 10>

Figure 3:
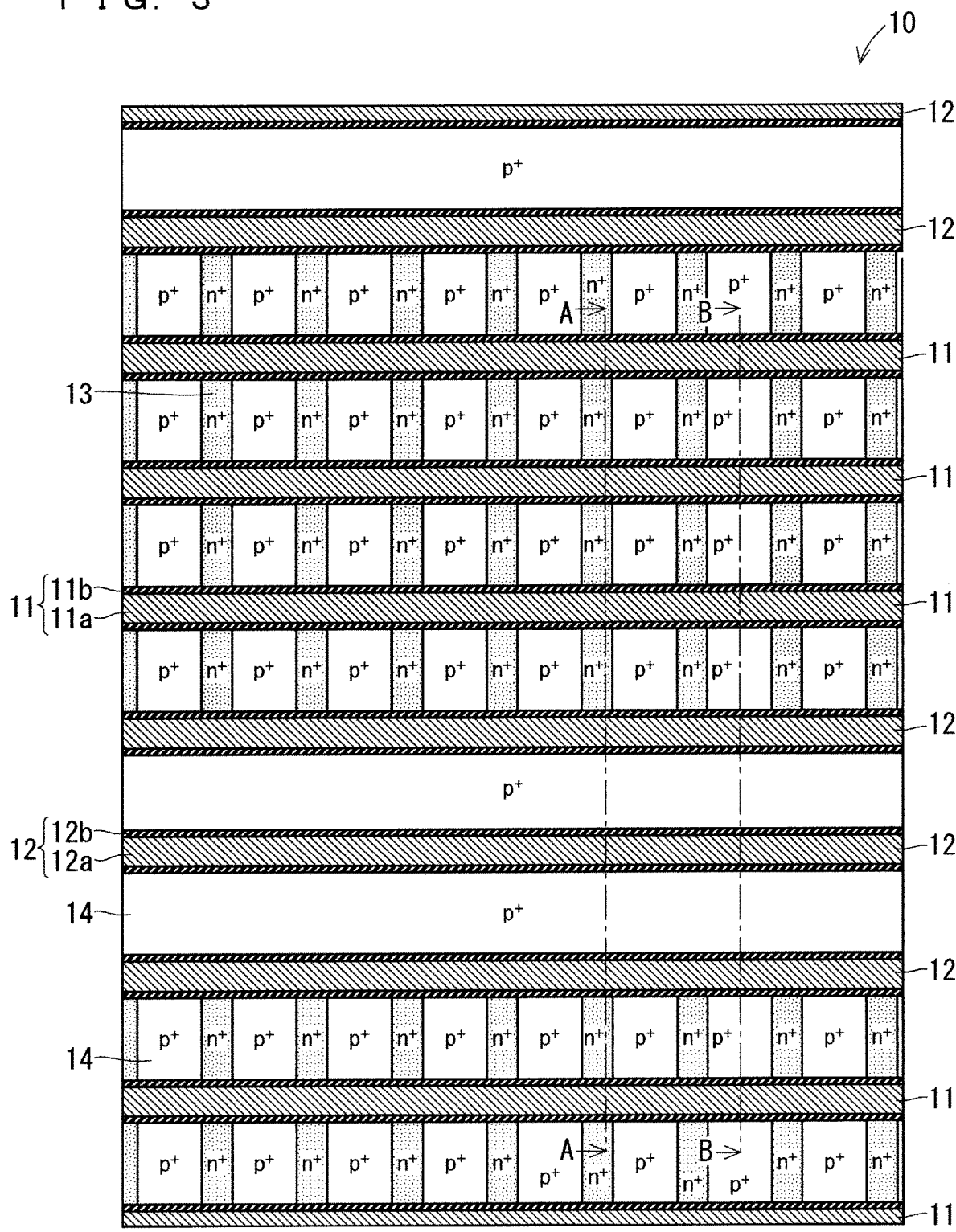
FIG. 3 is a partially enlarged plan view illustrating a structure of an IGBT region of the semiconductor device according to the first preferred embodiment.

FIG. 3 is a partially enlarged plan view illustrating a structure of the IGBT region 10 of a semiconductor device that is an RC-IGBT. Specifically, FIG. 3 is an enlarged view of a region surrounded by a broken line 82 in the semiconductor device 100 illustrated in FIG. 1 or the semiconductor device 101 illustrated in FIG. 2.

Figure 4:
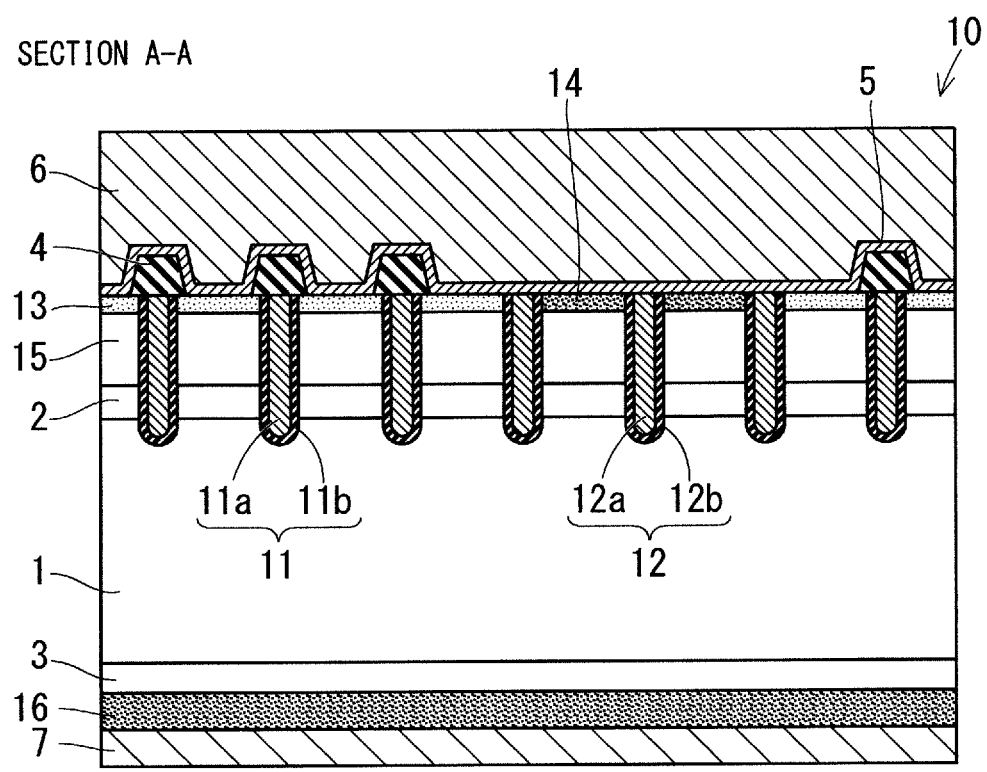
FIGS. 4 and 5 are each a sectional view illustrating a structure of the IGBT region of the semiconductor device according to the first preferred embodiment.
Figure 5:
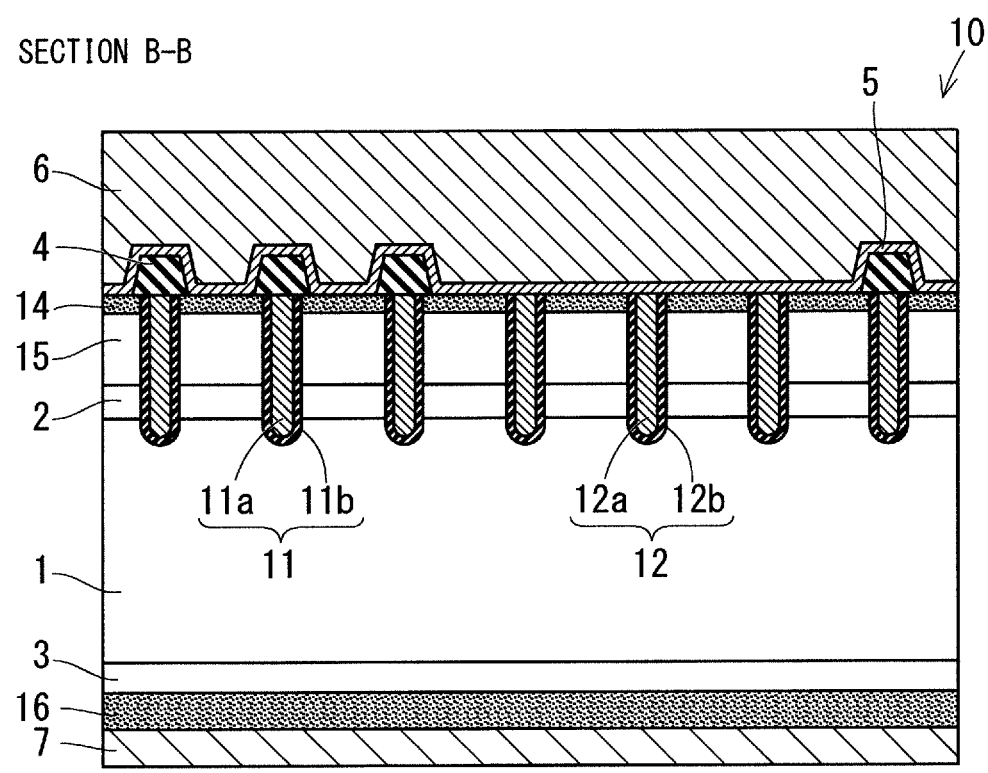

FIGS. 4 and 5 are each a sectional view illustrating a structure of the IGBT region 10 of the semiconductor device that is an RC-IGBT. Specifically, FIG. 4 is a sectional view taken along dot-and-dash line A-A of the semiconductor device 100, 101 illustrated in FIG. 3, and FIG. 5 is a sectional view taken along dot-and-dash line B-B of the semiconductor device 100, 101 illustrated in FIG. 3.

As illustrated in FIG. 3, the IGBT region 10 includes an active trench gate 11 and a dummy trench gate 12 that are each are provided in a stripe shape. The semiconductor device 100 is configured such that the active trench gate 11 and the dummy trench gate 12 extend in a longitudinal direction of the IGBT region 10, and the longitudinal direction of the IGBT region 10 corresponds to a longitudinal direction of each of the active trench gate 11 and the dummy trench gate 12. In contrast, the semiconductor device 101 is configured such that a longitudinal direction and a lateral direction are not particularly distinguished in the IGBT region 10, and a left-right direction in the drawing may correspond to the longitudinal direction of the active trench gate 11 and the dummy trench gate 12, or a vertical direction in the drawing may correspond to the longitudinal direction of the active trench gate 11 and the dummy trench gate 12.

The active trench gate 11 is composed of a gate trench electrode 11a provided in a trench of a semiconductor substrate via a gate trench insulating film 11b. The dummy trench gate 12 is composed of a dummy trench electrode 12a provided in a trench of the semiconductor substrate via a dummy trench insulating film 12b. The gate trench electrode 11a of the active trench gate 11 is electrically connected to the gate pad 41c. The dummy trench electrode 12a of the dummy trench gate 12 is electrically connected to an emitter electrode provided on the first main surface of the semiconductor device 100, 101.

An n$^+$-type source layer 13 is provided in contact with the gate trench insulating film 11b on each side of the active trench gate 11 in its width direction. The n$^+$-type source layer 13 is a semiconductor layer having, for example, arsenic or phosphorus as n-type impurities, and the n-type impurities have a concentration of $1.0E+17/cm^3$ to $1.0E+20/cm^3$, for example. The n$^+$-type source layer 13 is provided alternately with a p$^+$-type contact layer 14 along an extending direction of the active trench gate 11. The p$^+$-type contact layer 14 is provided between two adjacent dummy trench gates 12 in contact with the dummy trench insulating film 12b. The p$^+$-type contact layer 14 is a semiconductor layer having, for example, boron or aluminum as p-type impurities, and the p-type impurities have a concentration of $1.0E+15/cm^3$ to $1.0E+20/cm^3$, for example.

As illustrated in FIG. 3, in the IGBT region 10 of the semiconductor device 100, 101, three dummy trench gates 12 disposed side by side are disposed next to three active trench gates 11 disposed side by side. Then, next to the three dummy trench gates 12 disposed side by side, three active trench gates 11 different from the above are disposed side by side. As described above, the IGBT region 10 has a structure in which a set of active trench gates 11 and a set of dummy trench gates 12 are alternately disposed. Although in FIG. 3, the number of active trench gates 11 included in one set of active trench gates 11 is set to three, it may be one or more. The number of dummy trench gates 12 included in one set of dummy trench gates 12 may be one or more, and the number of dummy trench gates 12 may be zero. That is, all of the trench gates provided in the IGBT region 10 may be active trench gates 11.

FIG. 4 is a sectional view of the semiconductor device 100, 101, taken along dot-and-dash line A-A in FIG. 3, and is a sectional view of the IGBT region 10. The semiconductor device 100, 101 includes an n$^-$-type drift layer 1 composed of a semiconductor substrate. The n$^-$-type drift layer 1 is a semiconductor layer having, for example, arsenic or phosphorus as n-type impurities, and the n-type impurities have a concentration of $1.0E+12/cm^3$ to $1.0E+15/cm^3$, for example. The concentration of n-type impurities in the n$^+$-type source layer 13 described above is higher than the concentration of n-type impurities in the n$^-$-type drift layer 1.

In FIG. 4, the semiconductor substrate ranges from the n$^+$-type source layer 13 and the p$^+$-type contact layer 14 to a p-type collector layer 16. In FIG. 4, an upper end of the n$^+$-type source layer 13 and the p$^+$-type contact layer 14 in the drawing is referred to as the first main surface being the side of the first main surface of the semiconductor substrate, and a lower end of the p-type collector layer 16 in the drawing is referred to as the second main surface being the side of the second main surface of the semiconductor substrate. The first main surface of the semiconductor substrate is the main surface on a front surface side of the semiconductor device 100, 101, and the second main surface of the semiconductor substrate is the main surface on a back surface side of the semiconductor device 100, 101. The semiconductor device 100, 101 includes the n⁻-type drift layer 1 between the first main surface and the second main surface facing the first main surface in the IGBT region 10 of the cell region. The semiconductor substrate may be configured including, for example, at least one of a wafer and an epitaxial growth layer. The semiconductor substrate may include a wide bandgap semiconductor (silicon carbide (SiC), gallium nitride (GaN), diamond) capable of stable operation under high temperature.

As illustrated in FIG. 4, the IGBT region 10 includes an n-type carrier storage layer 2 that is provided on the first main surface side of the n⁻-type drift layer 1, and that has a higher concentration of n-type impurities than the n⁻-type drift layer 1. The n-type carrier storage layer 2 is a semiconductor layer having, for example, arsenic or phosphorus as n-type impurities, and the n-type impurities have a concentration of $1.0E+13/cm^3$ to $1.0E+17/cm^3$, for example. The semiconductor device 100, 101 may be configured such that the n-type carrier storage layer 2 is not provided and the n⁻-type drift layer 1 is also provided in a region of the n-type carrier storage layer 2 illustrated in FIG. 4. Providing the n-type carrier storage layer 2 enables reducing electric power loss when a current flows in the IGBT region 10. The n-type carrier storage layer 2 and the n⁻-type drift layer 1 may be collectively referred to as a drift layer.

The n-type carrier storage layer 2 is formed such that n-type impurities are ion-implanted into the semiconductor substrate constituting the n⁻-type drift layer 1, and then injected n-type impurities are spread into the semiconductor substrate being the n⁻-type drift layer 1 by annealing.

A p-type base layer 15 is provided on the first main surface side of the n-type carrier storage layer 2. The p-type base layer 15 is a semiconductor layer having, for example, boron or aluminum as p-type impurities, and the p-type impurities have a concentration of $1.0E+12/cm^3$ to $1.0E+19/cm^3$, for example. The p-type base layer 15 is in contact with the gate trench insulating film 11b of the active trench gate 11.

The n⁺-type source layer 13 in contact with the gate trench insulating film 11b of the active trench gate 11 is provided in a part of a region on the first main surface side of the p-type base layer 15, and the p⁺-type contact layer 14 is selectively provided in the other of the region on the first main surface side of the p-type base layer 15. The n⁺-type source layer 13 and the p⁺-type contact layer 14 constitute the first main surface of the semiconductor substrate. The p⁺-type contact layer 14 is a region having a higher concentration of p-type impurities than the p-type base layer 15. When the p⁺-type contact layer 14 and the p-type base layer 15 need to be distinguished from each other, they may be referred to individually. Alternatively, the p⁺-type contact layer 14 and the p-type base layer 15 may be collectively referred to as a p-type base layer.

In the semiconductor device 100,101, an n-type buffer layer 3 having a higher concentration of n-type impurities than the n⁻-type drift layer 1 is provided on the second main surface side of the n⁻-type drift layer 1. The n-type buffer layer 3 is provided to prevent a depletion layer extending from the p-type base layer 15 toward the second main surface from punching through when the semiconductor device 100, 101 is turned off. The n-type buffer layer 3 may be formed by injecting phosphorus (P) or a proton (H⁺), for example, or may be formed by injecting both phosphorus (P) and a proton (H⁺). The n-type buffer layer 3 includes n-type impurities having a concentration of $1.0E+12/cm^3$ to $1.0E+18/cm^3$, for example. The semiconductor device 100, 101 may be configured such that the n-type buffer layer 3 is not provided and the n⁻-type drift layer 1 is provided in a region of the n-type buffer layer 3 illustrated in FIG. 4. The n-type buffer layer 3 and the n⁻-type drift layer 1 may be collectively referred to as a drift layer.

In the semiconductor device 100,101, the p-type collector layer 16 is provided on the second main surface side of the n-type buffer layer 3. That is, the p-type collector layer 16 is provided between the n⁻-type drift layer 1 and the second main surface. The p-type collector layer 16 is a semiconductor layer having, for example, boron or aluminum as p-type impurities, and the p-type impurities have a concentration of $1.0E+16/cm^3$ to $1.0E+20/cm^3$, for example. The p-type collector layer 16 constitutes the second main surface of the semiconductor substrate. The p-type collector layer 16 may be provided not only in the IGBT region 10 but also in the terminal region 30. The p-type collector layer 16 may partially protrude from the IGBT region 10 to the diode region 20.

As illustrated in FIG. 4, the IGBT region 10 of the semiconductor device 100, 101 is provided with a trench that passes through the p-type base layer 15 from the first main surface of the semiconductor substrate and reaches the n⁻-type drift layer 1. The active trench gate 11 is composed of the gate trench electrode 11a provided in each of some trenches via the gate trench insulating film 11b. The gate trench electrode 11a faces the n⁻-type drift layer 1 with the gate trench insulating film 11b interposed therebetween. The dummy trench gate 12 is composed of the dummy trench electrode 12a provided in each of some trenches via the dummy trench insulating film 12b. The dummy trench electrode 12a faces the n⁻-type drift layer 1 with the dummy trench insulating film 12b interposed therebetween.

The gate trench insulating film 11b of the active trench gate 11 is in contact with the p-type base layer 15 and the n⁺-type source layer 13. When gate drive voltage is applied to the gate trench electrode 11a, a channel is formed in the p-type base layer 15 in contact with the gate trench insulating film 11b of the active trench gate 11.

As illustrated in FIG. 4, an interlayer insulating film 4 is provided on the gate trench electrode 11a of the active trench gate 11. A barrier metal 5 is provided on a region where the interlayer insulating film 4 is not provided on the first main surface of the semiconductor substrate and on the interlayer insulating film 4. The barrier metal 5 may be, for example, a conductor containing titanium (Ti), specifically, titanium nitride, or TiSi obtained by alloying titanium and silicon (Si). As illustrated in FIG. 4, the barrier metal 5 is in ohmic contact with the n⁺-type source layer 13, the p⁺-type contact layer 14, and the dummy trench electrode 12a, and is electrically connected to the n⁺-type source layer 13, the p⁺-type contact layer 14 and the dummy trench electrode 12a. Then, the barrier metal 5 is electrically insulated from the gate trench electrode 11a by the interlayer insulating film 4.

An emitter electrode 6 is provided on the barrier metal 5. The emitter electrode 6 may be formed of, for example, an aluminum alloy such as an aluminum silicon alloy (Al—Si based alloy), and may be composed of multiple layers of metal films in which plating films are formed on an electrode formed of the aluminum alloy by electroless plating or electrolytic plating. The plating films formed by electroless plating or electrolytic plating may be each a nickel (Ni) plating film, for example. When there is a fine region such as between adjacent interlayer insulating films 4 where good embedding cannot be obtained with the emitter electrode 6, a tungsten film having better embedding properties than the emitter electrode 6 may be disposed in the fine region to provide the emitter electrode 6 on the tungsten film. The emitter electrode 6 may be provided on the n+-type source layer 13, the p+-type contact layer 14, and the dummy trench electrode 12a without providing the barrier metal 5. The barrier metal 5 may be provided only on an n-type semiconductor layer such as the n+-type source layer 13. The barrier metal 5 and the emitter electrode 6 may be collectively referred to as an emitter electrode.

Although FIG. 4 illustrates a structure in which the interlayer insulating film 4 is not provided on the dummy trench electrode 12a of the dummy trench gate 12, the interlayer insulating film 4 may be provided on the dummy trench electrode 12a of the dummy trench gate 12 in a sectional portion of FIG. 4. When the interlayer insulating film 4 is provided on the dummy trench electrode 12a of the dummy trench gate 12 in the sectional portion of FIG. 4, the emitter electrode 6 and the dummy trench electrode 12a may be electrically connected in another sectional portion.

A collector electrode 7 is provided on the second main surface side of the p-type collector layer 16. As with the emitter electrode 6, the collector electrode 7 may be composed of an aluminum alloy or multiple layers of an aluminum alloy with a plating film. The collector electrode 7 may be different in structure from the emitter electrode 6. The collector electrode 7 is in ohmic contact with the p-type collector layer 16 and is electrically connected to the p-type collector layer 16.

FIG. 5 is a sectional view of the semiconductor device 100, 101, taken along dot-and-dash line B-B in FIG. 3, and is a sectional view of the IGBT region 10. Unlike the sectional portion taken along dot-and-dash line A-A illustrated in FIG. 4, the sectional portion taken along dot-and-dash line B-B of FIG. 5 does not include the n+-type source layer 13 that is in contact with the active trench gate 11 and is provided on the first main surface side of the semiconductor substrate. That is, the n+-type source layer 13 illustrated in FIG. 3 is selectively provided on the first main surface side of the p-type base layer. The p-type base layer referred to here includes the p-type base layer 15 and the p+-type contact layer 14.

<Diode Region 20>

Figure 6:
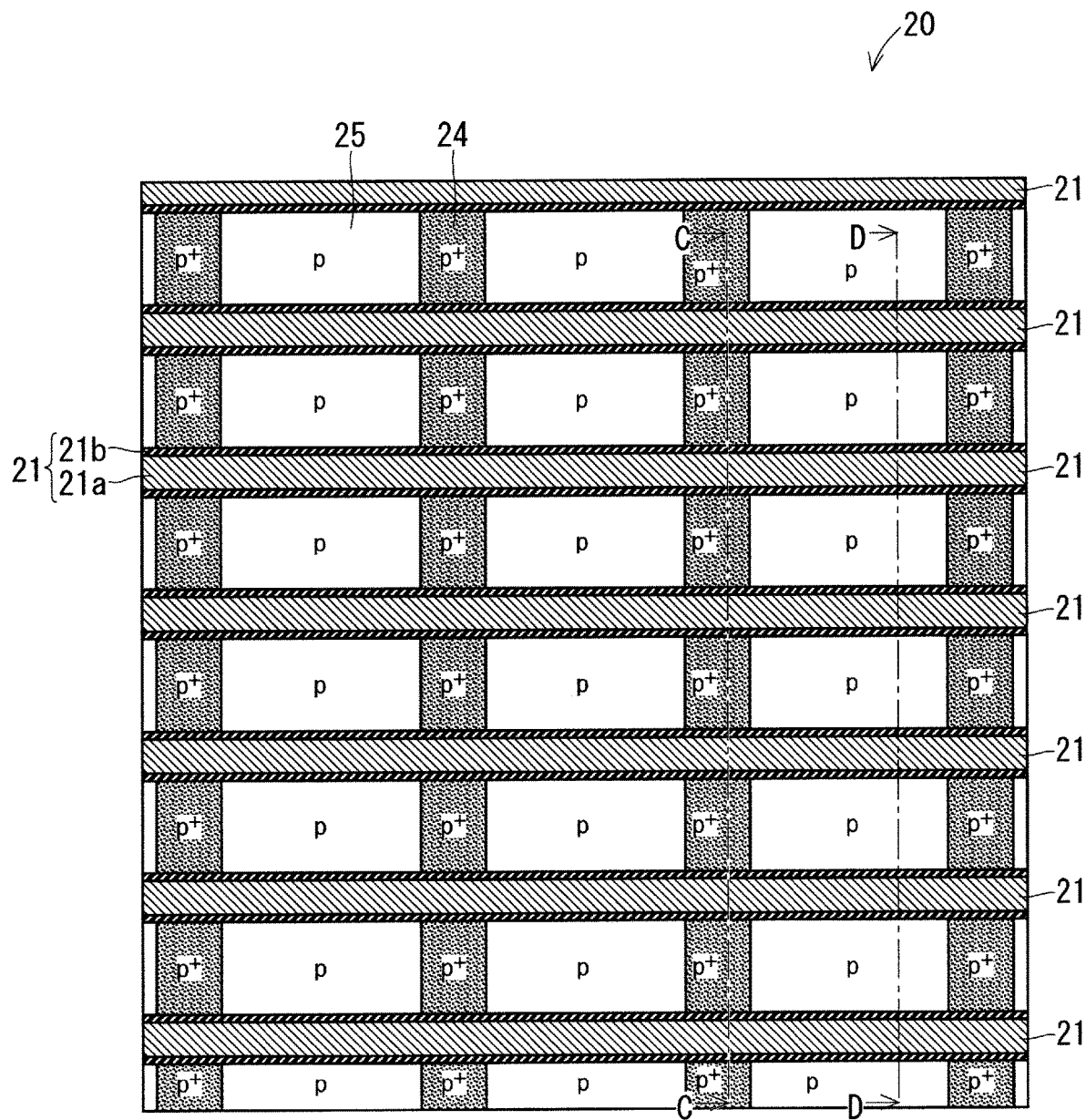
FIG. 6 is a partially enlarged plan view illustrating a structure of a diode region of the semiconductor device according to the first preferred embodiment.

FIG. 6 is a partially enlarged plan view illustrating a structure of the diode region 20 of the semiconductor device that is an RC-IGBT. Specifically, FIG. 6 is an enlarged view of a region surrounded by a broken line 83 in the semiconductor device 100, 101 illustrated in FIG. 1.

Figure 8:
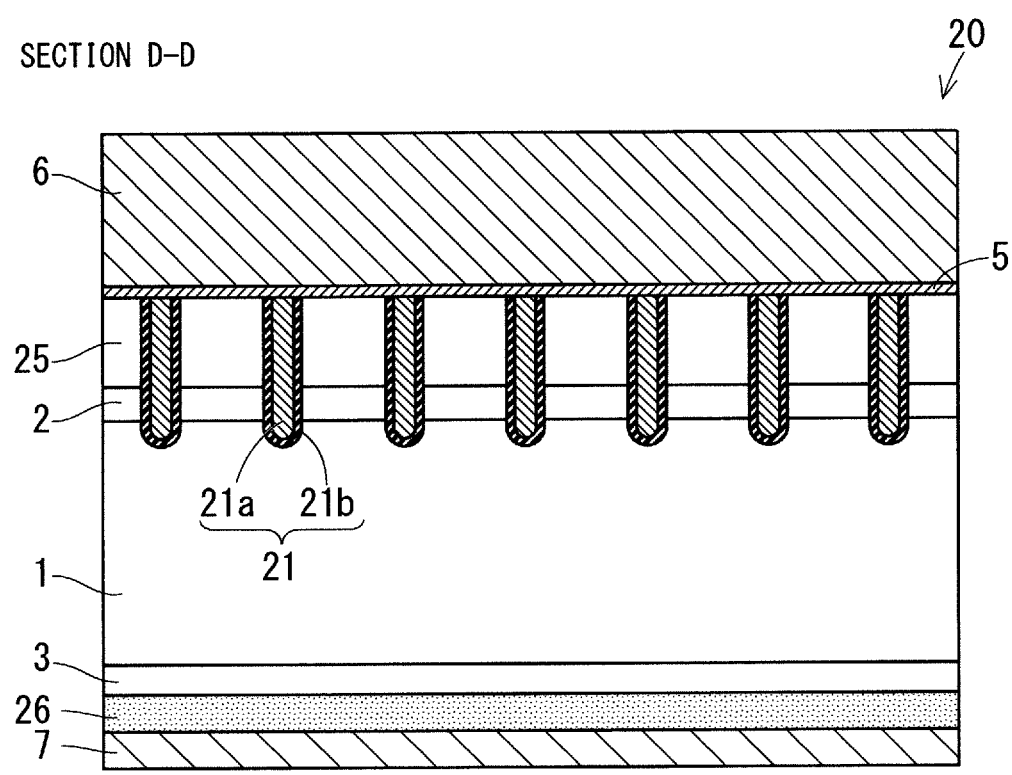

FIGS. 7 and 8 are each a sectional view illustrating the structure of the diode region 20 of the semiconductor device that is an RC-IGBT. Specifically, FIG. 7 is a sectional view taken along dot-and-dash line C-C of the semiconductor device 100, 101 illustrated in FIG. 6, and FIG. 8 is a sectional view taken along dot-and-dash line D-D of the semiconductor device 100, 101 illustrated in FIG. 6.

Diode trench gates 21 are provided along the first main surface of the semiconductor device 100, 101 while extending from one end side of the diode region 20 in the cell region toward the other end side facing the one end side. A diode trench gate 21 is composed of a diode trench electrode 21a provided in a trench in the diode region 20 via a diode trench insulating film 21b. The diode trench electrode 21a faces the n⁻-type drift layer 1 with the diode trench insulating film 21b interposed therebetween.

Between two adjacent diode trench gates 21, a p+-type contact layer 24 and a p-type anode layer 25 having a lower concentration of p-type impurities than the p+-type contact layer 24 are provided. The p+-type contact layer 24 is a semiconductor layer having, for example, boron or aluminum as p-type impurities, and the p-type impurities have a concentration of $1.0\text{E}+15/\text{cm}^3$ to $1.0\text{E}+20/\text{cm}^3$, for example. The p-type anode layer 25 is a semiconductor layer having, for example, boron or aluminum as p-type impurities, and the p-type impurities have a concentration of $1.0\text{E}+12/\text{cm}^3$ to $1.0\text{E}+19/\text{cm}^3$, for example. The p+-type contact layer 24 and the p-type anode layer 25 are alternately provided in a longitudinal direction of the diode trench gate 21.

FIG. 7 is a sectional view of the semiconductor device 100, 101, taken along dot-and-dash line C-C in FIG. 6, and is a sectional view of the diode region 20. The semiconductor device 100, 101 includes the diode region 20 that also has the n⁻-type drift layer 1 composed of a semiconductor substrate as with the IGBT region 10. The n⁻-type drift layer 1 in the diode region 20 and the n⁻-type drift layer 1 in the IGBT region 10 are continuously and integrally formed in an identical semiconductor substrate.

In FIG. 7, the semiconductor substrate ranges from the p+-type contact layer 24 to an n+-type cathode layer 26. In FIG. 7, an upper end of the p+-type contact layer 24 in the drawing is referred to as the first main surface of the semiconductor substrate, and a lower end of the n+-type cathode layer 26 in the drawing is referred to as the second main surface of the semiconductor substrate. The first main surface of the diode region 20 and the first main surface of the IGBT region 10 are included in the same surface, and the second main surface of the diode region 20 and the second main surface of the IGBT region 10 are included in the same surface.

As illustrated in FIG. 7 and as with the IGBT region 10, in the diode region 20, the n-type carrier storage layer 2 is provided on the first main surface side of n⁻-type drift layer 1, and the n-type buffer layer 3 is provided on the second main surface side of n⁻-type drift layer 1. The n-type carrier storage layer 2 and the n-type buffer layer 3 provided in the diode region 20 may be identical in structure to the n-type carrier storage layer 2 and the n-type buffer layer 3 provided in the IGBT region 10. The n-type carrier storage layer 2 is not necessarily provided in the IGBT region 10 and the diode region 20. For example, the n-type carrier storage layer 2 may be provided in the IGBT region 10, but may not be provided in the diode region 20. As in the IGBT region 10, the n⁻-type drift layer 1, the n-type carrier storage layer 2, and the n-type buffer layer 3 may be collectively referred to as a drift layer.

The p-type anode layer 25 is provided on the first main surface side of n-type carrier storage layer 2. The p-type anode layer 25 is provided between the n⁻-type drift layer 1 and the first main surface. The p-type anode layer 25 and the p-type base layer 15 may be simultaneously formed by allowing the p-type anode layer 25 and the p-type base layer 15 in the IGBT region 10 to be identical in concentration of p-type impurities. The p-type anode layer 25 may be configured to have a concentration of p-type impurities that is lower than a concentration of p-type impurities of the p-type base layer 15 in the IGBT region 10 so that the amount of positive holes to be injected into the diode region 20 during diode operation is reduced. When the amount of positive holes to be injected during diode operation is reduced, recovery loss during the diode operation can be reduced.

The p+-type contact layer 24 is provided on the first main surface side of p-type anode layer 25. The p+-type contact layer 24 may have a concentration of p-type impurities that is identical to or different from a concentration of p-type impurities of the p+-type contact layer 14 in the IGBT region 10. The p+-type contact layer 24 constitutes the first main surface of the semiconductor substrate. The p$^+$-type contact layer 24 is a region in which a concentration of p-type impurities is higher than that of the p-type anode layer 25. When the p$^+$-type contact layer 24 and the p-type anode layer 25 need to be distinguished, they may be referred to individually. Alternatively, the p$^+$-type contact layer 24 and the p-type anode layer 25 may be collectively referred to as a p-type anode layer.

The n$^+$-type cathode layer 26 is provided on the second main surface side of the semiconductor device 100,101 includes the n-type buffer layer 3. That is, the n$^+$-type cathode layer 26 is provided between the n$^-$-type drift layer 1 and the second main surface. The n$^+$-type cathode layer 26 is a semiconductor layer having, for example, arsenic or phosphorus as n-type impurities, and the n-type impurities have a concentration of $1.0E+16/cm^3$ to $1.0E+21/cm^3$, for example. The n$^+$-type cathode layer 26 is provided in a part or all of the diode region 20. The n$^+$-type cathode layer 26 constitutes the second main surface of the semiconductor substrate. Although not illustrated, a p-type cathode layer being a p-type semiconductor may be provided by selectively injecting p-type impurities into a part of a region where the n$^+$-type cathode layer 26 is formed.

As illustrated in FIG. 7, the diode region 20 of the semiconductor device 100, 101 is provided with a trench that passes through the p-type anode layer 25 from the first main surface of the semiconductor substrate and reaches the n$^-$-type drift layer 1. The diode trench gate 21 is composed of the diode trench electrode 21a provided in a trench in the diode region 20 vis the diode trench insulating film 21b. The diode trench electrode 21a faces the n$^-$-type drift layer 1 with the diode trench insulating film 21b interposed therebetween.

As illustrated in FIG. 7, the barrier metal 5 is provided on the diode trench electrode 21a and the p$^+$-type contact layer 24. The barrier metal 5 is in ohmic contact with the diode trench electrode 21a and the p$^+$-type contact layer 24, and is electrically connected to the diode trench electrode 21a and the p$^+$-type contact layer 24. The barrier metal 5 may be identical in structure to the barrier metal 5 in the IGBT region 10.

An emitter electrode 6 is provided on the barrier metal 5. The emitter electrode 6 provided in the diode region 20 is continuously formed with the emitter electrode 6 provided in the IGBT region 10. As in the case of the IGBT region 10, the diode trench electrode 21a and the p$^+$-type contact layer 24 may be brought into ohmic contact with the emitter electrode 6 without providing the barrier metal 5.

Although FIG. 7 illustrates a structure in which the interlayer insulating film 4 as illustrated in FIG. 4 is not provided on the diode trench electrode 21a of the diode trench gate 21, the interlayer insulating film 4 may be provided on the trench electrode 21a in a sectional portion of FIG. 7. When the interlayer insulating film 4 is provided on the diode trench electrode 21a of the diode trench gate 21 in the sectional portion of FIG. 7, the emitter electrode 6 and the diode trench electrode 21a may be electrically connected in another sectional portion.

The collector electrode 7 is provided on the second main surface side of the n$^+$-type cathode layer 26. As with the emitter electrode 6, the collector electrode 7 in the diode region 20 is continuously formed with the collector electrode 7 provided in the IGBT region 10. The collector electrode 7 is in ohmic contact with the n$^+$-type cathode layer 26 and is electrically connected to the n$^+$-type cathode layer 26.

FIG. 8 is a sectional view of the semiconductor device 100, 101, taken along dot-and-dash line D-D in FIG. 6, and is a sectional view of the diode region 20. Unlike the sectional portion taken along dot-and-dash line C-C illustrated in FIG. 7, the p$^+$-type contact layer 24 is not provided between the p-type anode layer 25 and the barrier metal 5 in the sectional portion taken along dot-and-dash line D-D of FIG. 8, and the p-type anode layer 25 is the first main surface of the semiconductor substrate. That is, the p$^+$-type contact layer 24 illustrated in FIG. 7 is selectively provided on the first main surface side of the p-type anode layer 25.

<Structure of Boundary Region Between IGBT Region 10 and Diode Region 20>

Figure 9:
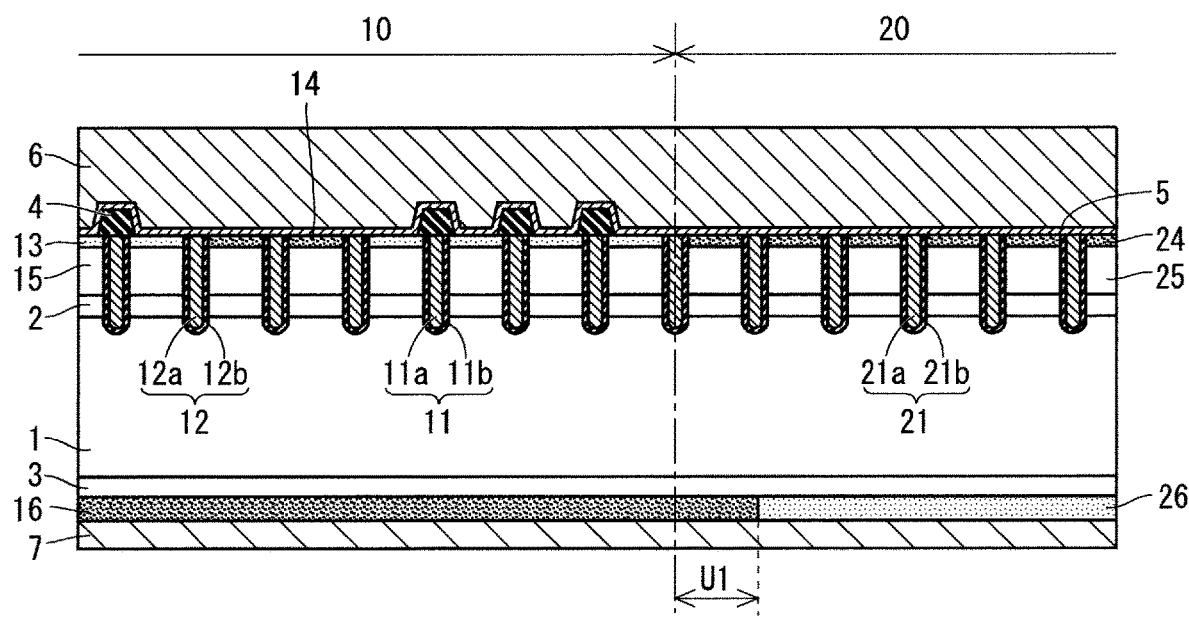
FIG. 9 is a sectional view illustrating a structure of a boundary region between the IGBT region and the diode region of the semiconductor device according to the first preferred embodiment.

FIG. 9 is a sectional view illustrating a structure of a boundary region between the IGBT region 10 and the diode region 20 of the semiconductor device that is an RC-IGBT. Specifically, FIG. 9 is a sectional view taken along dot-and-dash line E-E in each of the semiconductor devices 100, 101 illustrated in FIGS. 1 and 2, respectively.

As illustrated in FIG. 9, the p-type collector layer 16 provided on the second main surface side in the IGBT region 10 and the n$^+$-type cathode layer 26 provided on the second main surface side in the diode region 20 are adjacent to each other in an in-plane direction of the semiconductor substrate. The p-type collector layer 16 is provided protruding from the boundary between the IGBT region 10 and the diode region 20 toward the diode region 20 by a distance U1.

When the p-type collector layer 16 is provided protruding toward the diode region 20 as described above, a distance between the n$^+$-type cathode layer 26 in the diode region 20 and the active trench gate 11 can be increased. Thus, even when gate drive voltage is applied to the gate trench electrode 11a during operation of a freewheeling diode, a current can be prevented from flowing to the n$^+$-type cathode layer 26 from a channel formed adjacent to the active trench gate 11 in the IGBT region 10. The distance U1 may be, for example, 100 μm. The distance U1 may be zero or smaller than 100 μm depending on the use of the semiconductor device 100, 101 that is an RC-IGBT.

<Terminal Region 30>

Figure 10:
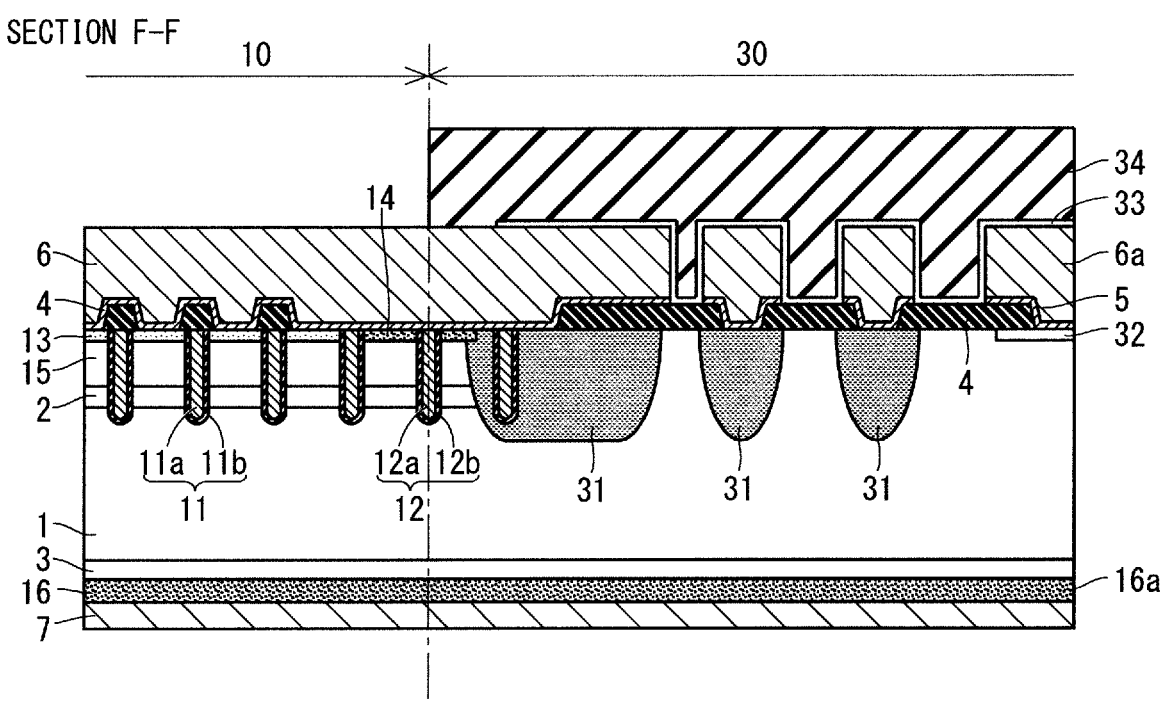
FIGS. 10 and 11 are each a sectional view illustrating a structure of a terminal region of the semiconductor device according to the first preferred embodiment.
Figure 11:
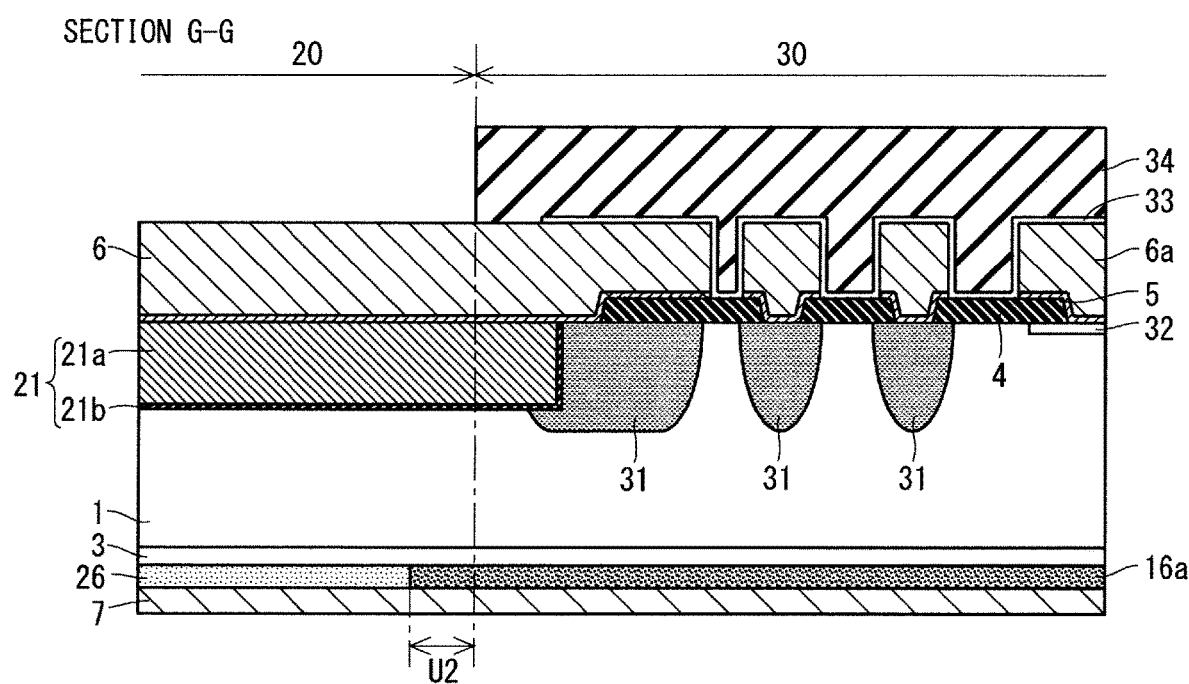

FIGS. 10 and 11 are each a sectional view illustrating a structure of a terminal region of the semiconductor device that is an RC-IGBT. Specifically, FIG. 10 is a sectional view taken along dot-and-dash line F-F in FIG. 1 or 2, and is a sectional view from the IGBT region 10 to the terminal region 30. FIG. 11 is a sectional view taken along dot-and-dash line G-G in FIG. 1, and is a sectional view from the diode region 20 to the terminal region 30.

As shown in FIGS. 10 and 11, the terminal region 30 of the semiconductor device 100 has an n$^-$-type drift layer 1 between the first main surface and the second main surface of the semiconductor substrate. The first main surface and the second main surface in the terminal region 30, and the first main surface and the second main surface in the IGBT region 10 and the diode region 20 are included in the same surface. The n$^-$-type drift layer 1 in the terminal region 30 is identical in structure to the n$^-$-type drift layer 1 in each of the IGBT region 10 and the diode region 20, and is continuously and integrally formed with the n$^-$-type drift layer 1 in each of them.

On the first main surface side of the n$^-$-type drift layer 1, i.e., between the first main surface of the semiconductor substrate and the n$^-$-type drift layer 1, a p-type terminal well layer 31 is selectively provided. The p-type terminal well layer 31 is a semiconductor layer having, for example, boron or aluminum as p-type impurities, and the p-type impurities have a concentration of $1.0E+14/cm^3$ to $1.0E+19/cm^3$, for example. The p-type terminal well layer 31 is provided surrounding the cell region including the IGBT region 10 and the diode region 20. Multiple p-type terminal well layers 31 are each provided in the shape of a ring, and the number of p-type terminal well layers 31 to be provided is appropriately selected depending on withstand voltage design of the semiconductor device 100, 101. Additionally, an n$^+$-type channel stopper layer 32 is provided on an edge side outward of the p-type terminal well layers 31, and the n$^+$-type channel stopper layer 32 surrounds the p-type terminal well layers 31 in plan view.

Between the n$^-$-type drift layer 1 and the second main surface of the semiconductor substrate in the terminal region 30, a p-type terminal collector layer 16a is provided. The p-type terminal collector layer 16a is continuously and integrally formed with the p-type collector layer 16 provided in the IGBT region 10 of the cell region. Thus, the p-type collector layer 16 including the p-type terminal collector layer 16a may be referred to as a p-type collector layer.

In a structure in which the diode region 20 is provided adjacent to the terminal region 30 as in the semiconductor device 100 illustrated in FIG. 1, the p-type terminal collector layer 16a is provided having an end portion close to the diode region 20, the end portion protruding toward the diode region 20 by only a distance U2 as illustrated in FIG. 11. This kind of structure enables increasing a distance between the n$^+$-type cathode layer 26 and the p-type terminal well layer 31 in the diode region 20, so that the p-type terminal well layer 31 can be prevented from operating as an anode of a diode. The distance U2 may be, for example, 100 µm.

The collector electrode 7 is provided on the second main surface of the semiconductor substrate. The collector electrode 7 is continuously and integrally formed from the cell region including the IGBT region 10 and the diode region 20 to the terminal region 30.

In contrast, the first main surface of the semiconductor substrate in the terminal region 30 is provided with the emitter electrode 6 extending continuously from the cell region, and a terminal electrode 6a structurally separated from the emitter electrode 6. The emitter electrode 6 and the terminal electrode 6a are electrically connected via a semi-insulating film 33. The semi-insulating film 33 may be, for example, a semi-insulating silicon nitride (sinSiN). The terminal electrode 6a and each of the p-type terminal well layer 31 and the n$^+$-type channel stopper layer 32 are electrically connected via a contact hole in the interlayer insulating film 4 provided on the first main surface of the terminal region 30. The terminal region 30 is provided with a terminal protective film 34 covering the emitter electrode 6, the terminal electrode 6a, and the semi-insulating film 33. The terminal protective film 34 is, for example, made of polyimide.

<Pad Region 40>

FIG. 12 is a sectional view illustrating a structure near the pad region 40 of the semiconductor device according to the first preferred embodiment. FIG. 12 illustrates not only the pad region 40 but also the IGBT region 10 and the diode region 20. To avoid duplicated description, the contents described in the IGBT region 10 and the diode region 20, particularly the contents such as abbreviation and names of components, are appropriately eliminated.

The pad region 40 includes a current sense region 41f corresponding to the current sense pad 41a of FIG. 1 or 2, and a separation region 41g. The IGBT region 10, the diode region 20, and the current sense region 41f are provided on the semiconductor substrate in the in-plane direction of the semiconductor substrate. The first preferred embodiment includes the current sense region 41f that is provided closer to the IGBT region 10 than to the diode region 20. The current sense region 41f has a structure similar to that of a portion provided with the active trench gate 11 in the IGBT region 10.

Specifically, the current sense region 41f includes the n-type carrier storage layer 2 that is provided on the first main surface side of the n$^-$-type drift layer 1, and the n-type buffer layer 3 that is provided on the second main surface side of the n$^-$-type drift layer 1.

A first semiconductor layer is provided on the first main surface side of n-type carrier storage layer 2. The first semiconductor layer according to the first preferred embodiment corresponds to the p-type base layer 15 in the IGBT region 10. The first semiconductor layer corresponding to the p-type base layer 15 includes the first semiconductor layer that is substantially the same as the p-type base layer 15. In the following description, the first semiconductor layer may be referred to as a "sense base layer 45a". The n$^+$-type source layer 13 is provided on the first main surface side of the sense base layer 45a.

As illustrated in FIG. 12, the current sense region 41f of the semiconductor device according to the first preferred embodiment is provided with a trench that passes through the sense base layer 45a from the first main surface of the semiconductor substrate and reaches the n$^-$-type drift layer 1. The sense trench gate 42 is composed of a sense trench electrode 42a provided in a trench in the current sense region 41f via a sense trench insulating film 42b.

The sense trench insulating film 42b of the sense trench gate 42 is in contact with the sense base layer 45a and the n$^+$-type source layer 13. When gate drive voltage is applied to the sense trench electrode 42a, a channel is formed in the sense base layer 45a in contact with the sense trench insulating film 42b of the sense trench gate 42.

The interlayer insulating film 4 is provided on the sense trench electrode 42a of the sense trench gate 42. A barrier metal 5 is provided on a region where the interlayer insulating film 4 is not provided on the first main surface of the semiconductor substrate and on the interlayer insulating film 4. The barrier metal 5 is electrically insulated from the sense trench electrode 42a by the interlayer insulating film 4. A current sense emitter electrode 17 is provided on the barrier metal 5, and the current sense emitter electrode 17 is insulated from the emitter electrode 6 by the interlayer insulating film 4 provided in the separation region 41g.

The semiconductor device according to the first preferred embodiment includes a second semiconductor layer that is provided on the second main surface side of the n-type buffer layer 3 in the current sense region 41f. The second semiconductor layer according to the first embodiment corresponds to the p-type collector layer 16 in the IGBT region 10. The second semiconductor layer corresponding to the p-type collector layer 16 includes the second semiconductor layer that is substantially the same as the p-type collector layer 16. In the following description, the second semiconductor layer may be referred to as a "sense collector layer 46a". In the current sense region 41f of FIG. 12, the semiconductor substrate ranges from the n$^+$-type source layer 13 to the sense collector layer 46a. The collector electrode 7 is provided on the second main surface side of on the sense collector layer 46a.

Between the n$^-$-type drift layer 1 on the first main surface side in the separation region 41g and a portion on the first main surface side in the IGBT region 10, a p-well layer 43 similar to the p-type ten final well layer 31 is provided. Between the n$^-$-type drift layer 1 on the first main surface side in the separation region 41g and a portion on the first main surface side in the current sense region 41f, the p-well layer 43 similar to the p-type terminal well layer 31 is provided.

Here, as illustrated in FIG. 12, a first distance from a channel of the sense base layer 45a to a third semiconductor layer along an in-plane direction is defined as W. The third semiconductor layer according to the first preferred embodiment is the n⁺-type cathode layer 26 in the diode region 20. In the first preferred embodiment, the channel of the sense base layer 45a is a portion of the sense base layer 45a in contact with the sense trench insulating film 42b. Thus, the first distance W according to the first preferred embodiment is the same or substantially the same as the shortest distance from a portion where a boundary portion between the sense base layer 45a and the n-type carrier storage layer 2 is in contact with the sense trench insulating film 42b to the n⁺-type cathode layer 26 in the diode region 20.

Next, as illustrated in FIG. 12, a second distance from the channel of the sense base layer 45a to the sense collector layer 46a is defined as S. In the first preferred embodiment, the channel of the sense base layer 45a is the portion of the sense base layer 45a in contact with the sense trench insulating film 42b as described above. Thus, the second distance S according to the first preferred embodiment is the same or substantially the same as the shortest distance from the portion where the boundary portion between the sense base layer 45a and the n-type carrier storage layer 2 is in contact with the sense trench insulating film 42b to the sense collector layer 46a.

A lifetime and a diffusion coefficient of a portion of the semiconductor substrate between the channel of the sense base layer 45a and the n⁺-type cathode layer 26 in the diode region 20 are defined as τ and D, respectively.

The lifetime τ can be calculated by a lifetime measuring instrument. The lifetime τ is calculated by, for example, a microwave photoconductive attenuation method (μ-PCD method). The μ-PCD method is a technique for measuring a lifetime from a microwave reflectance before and after laser irradiation. When excess carriers are generated in the portion described above of the semiconductor substrate by laser irradiation, the microwave reflectance increases as conductivity increases. After that, when the laser irradiation is stopped, the excess carriers decrease due to recombination to reduce the conductivity, and then the microwave reflectance also decreases. The microwave reflectance is proportional to carrier density, so that time when the microwave reflectance becomes 1/e where e is the natural logarithm can be observed as the lifetime τ.

The diffusion coefficient D can be acquired from the expression, D=μkTj/q. Here, μ is carrier mobility in a portion between the channel of the sense base layer 45a and the n⁺-type cathode layer 26, k is the Boltzmann constant, Tj is a maximum rated temperature of an RC-IGBT being a semiconductor device, and q is an elementary charge.

In the above structure, when voltage is applied to the gate trench electrode 11a and the sense trench electrode 42a to form a channel, a current flows in a longitudinal direction, i.e., in an out-of-plane direction of the semiconductor substrate in the IGBT region 10 and the current sense region 41f. The current flowing from the channel of the sense base layer 45a generally flows through the n⁻-type drift layer 1 to the sense collector layer 46a or the p-type collector layer 16 in the IGBT region 10. However, a part of the current tends to flow through the n⁺-type cathode layer 26 in the diode region 20.

Thus, the first preferred embodiment allows a linear distance, $(W^2+S^2)^{1/2}$, from the channel of the sense base layer 45a to the n⁺-type cathode layer 26 of the diode region 20 to be larger than a distance acquired by adding a diffusion length to the second distance S. That is, Expression (1) below is satisfied.

[Expression 1]

$$\sqrt{W^2+S^2} > S+\sqrt{D\tau} \qquad (1)$$

This Expression (1) is substantially identical to Expression (2) below, and Expression (2) below is satisfied in the first preferred embodiment.

[Expression 2]

$$W > \sqrt{2S\sqrt{D\tau}+D\tau} \qquad (2)$$

The first preferred embodiment as described above enables reducing an electron current flowing from a channel in the current sense region 41f into the n⁺-type cathode layer 26 in the diode region 20.

The first distance W may have an upper limit smaller than the distance acquired by adding the diffusion length to the second distance S. That is, Expression (3) below may be satisfied.

[Expression 3]

$$W < S+\sqrt{D\tau} \qquad (3)$$

<Method for Manufacturing RC-IGBT>

Figure 16A:
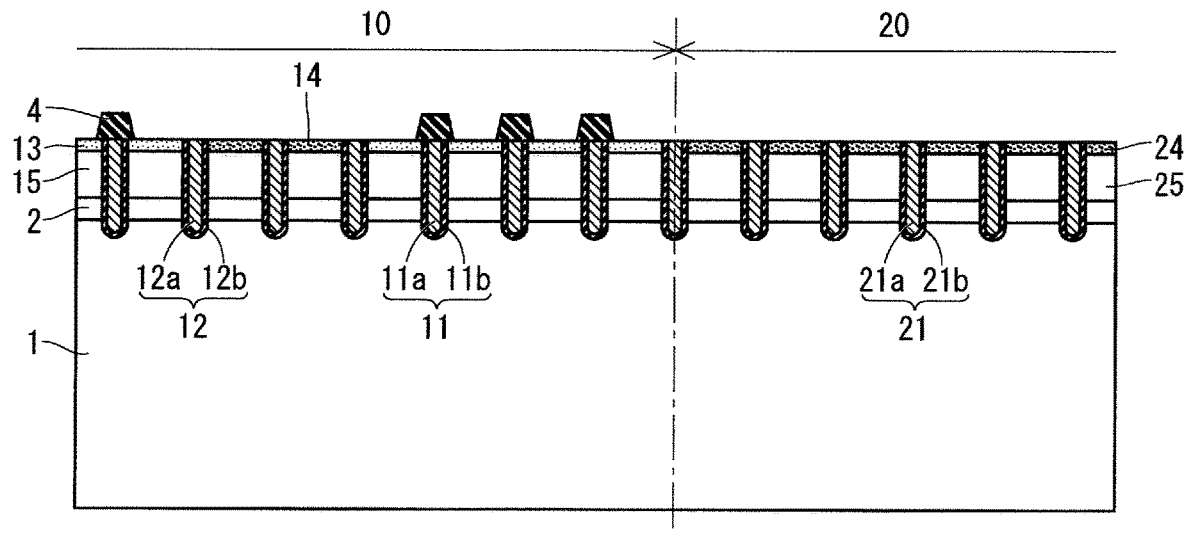
Figure 16B:
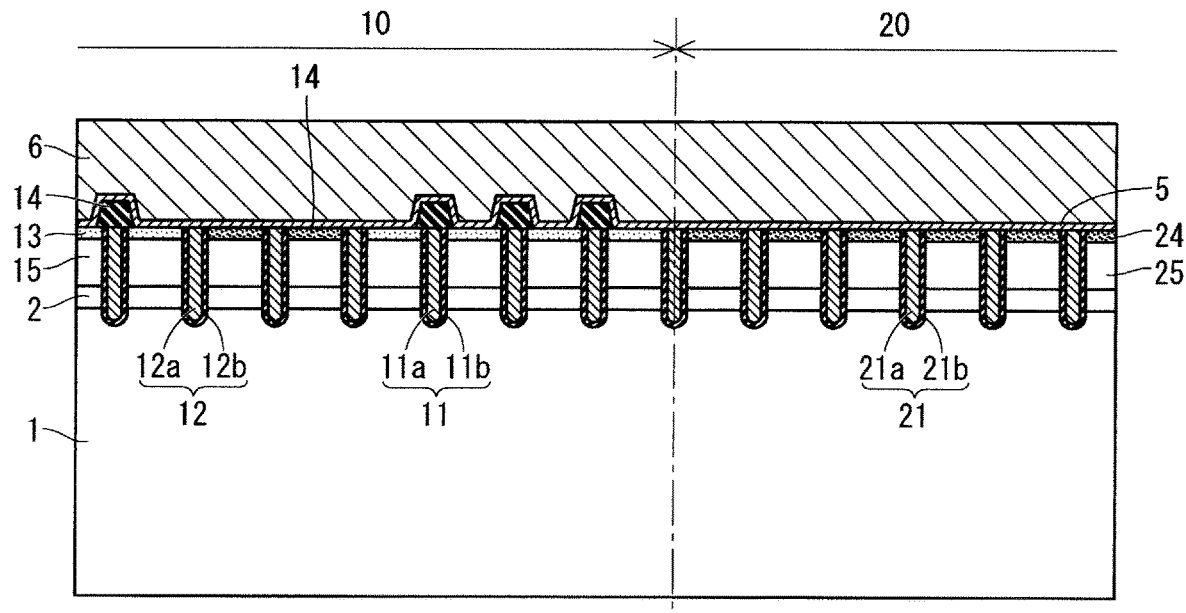
Figure 17A:
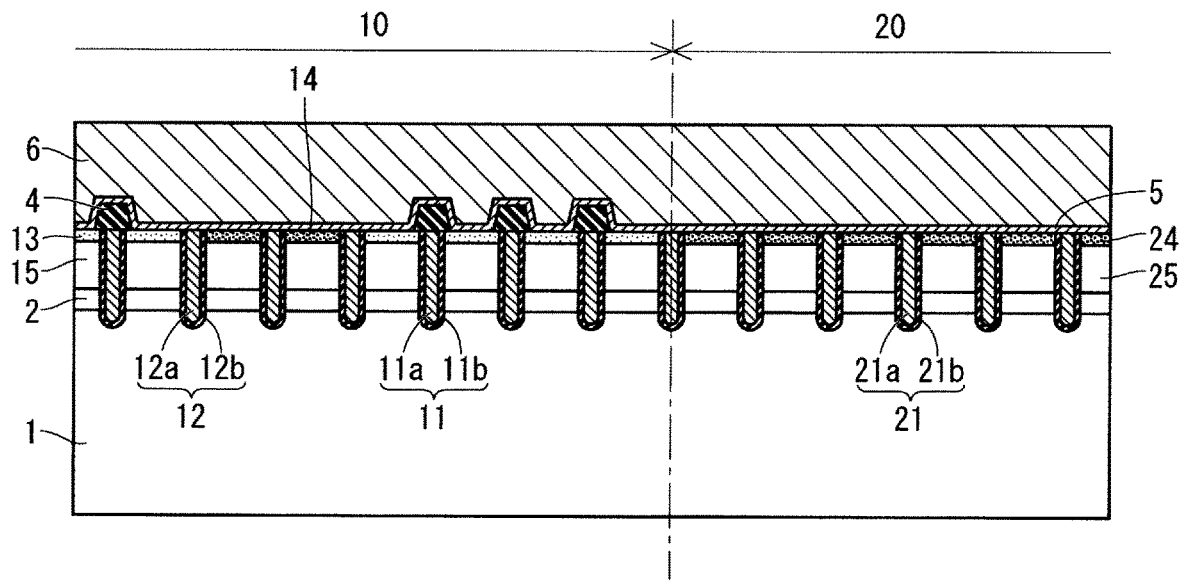
Figure 17B:
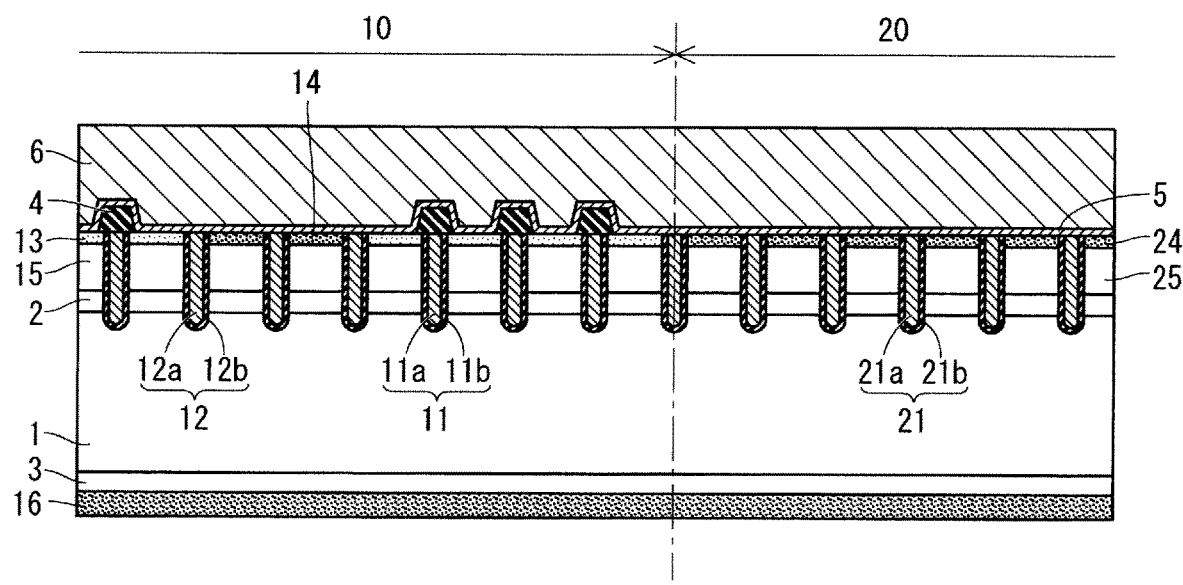
Figure 18A:
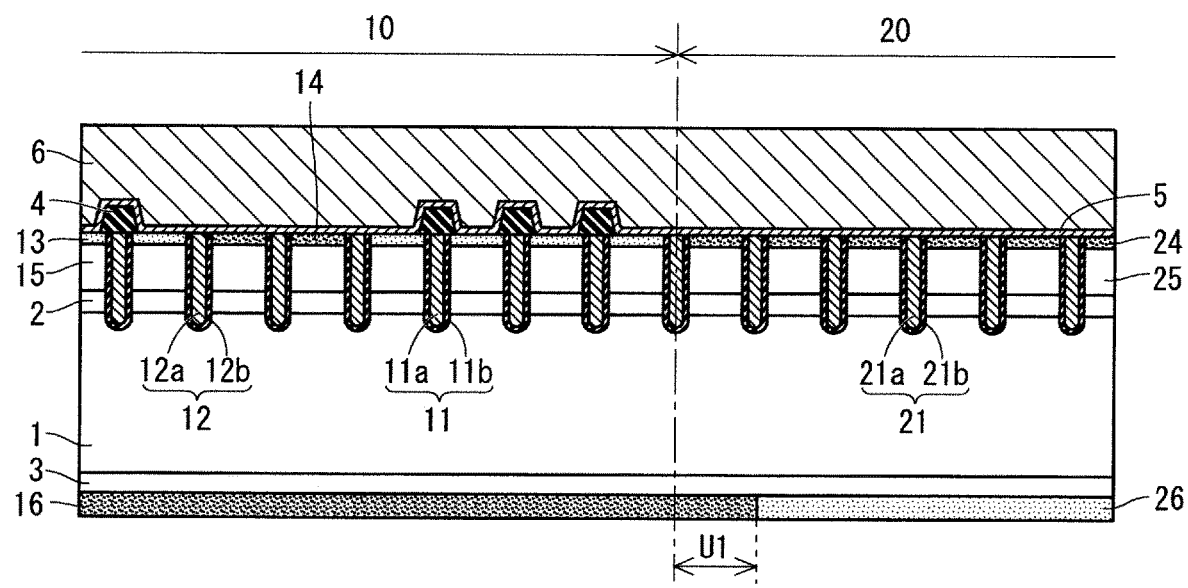
Figure 18B:
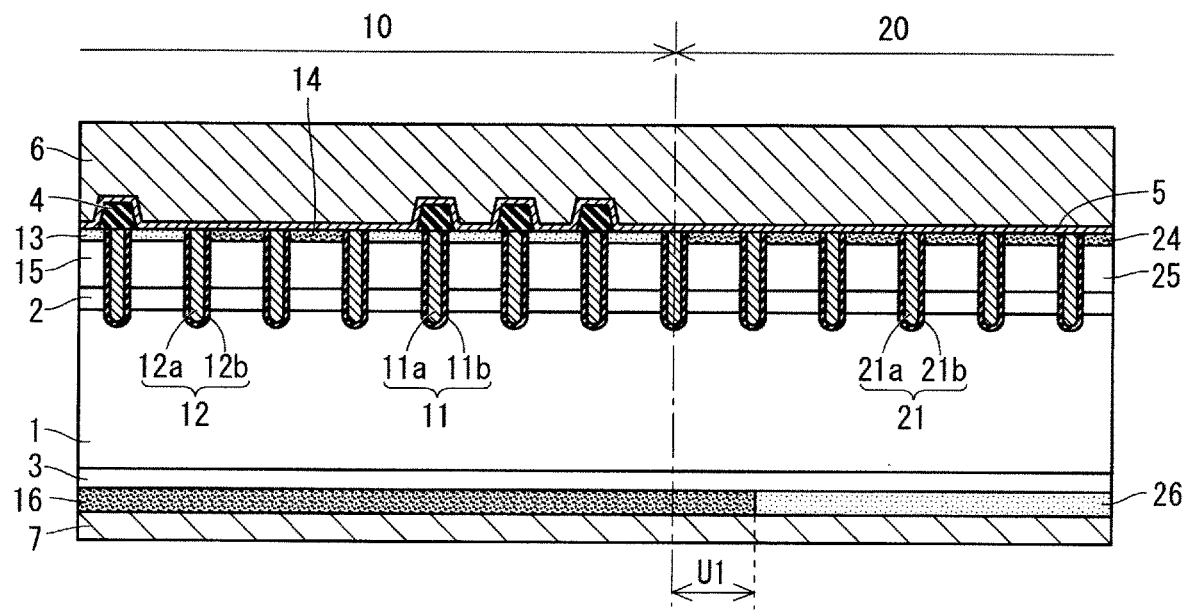

FIGS. 13A to 18B are each a sectional view illustrating a method for manufacturing a semiconductor device that is an RC-IGBT. FIGS. 13A to 16B are each a diagram illustrating a process of mainly forming a front surface side in the boundary region of FIG. 9 of the semiconductor device 100, 101. FIGS. 17A and 18B are each a diagram illustrating a process of mainly forming a back surface side in the boundary region of FIG. 9 of the semiconductor device 100, 101.

Figure 13A:
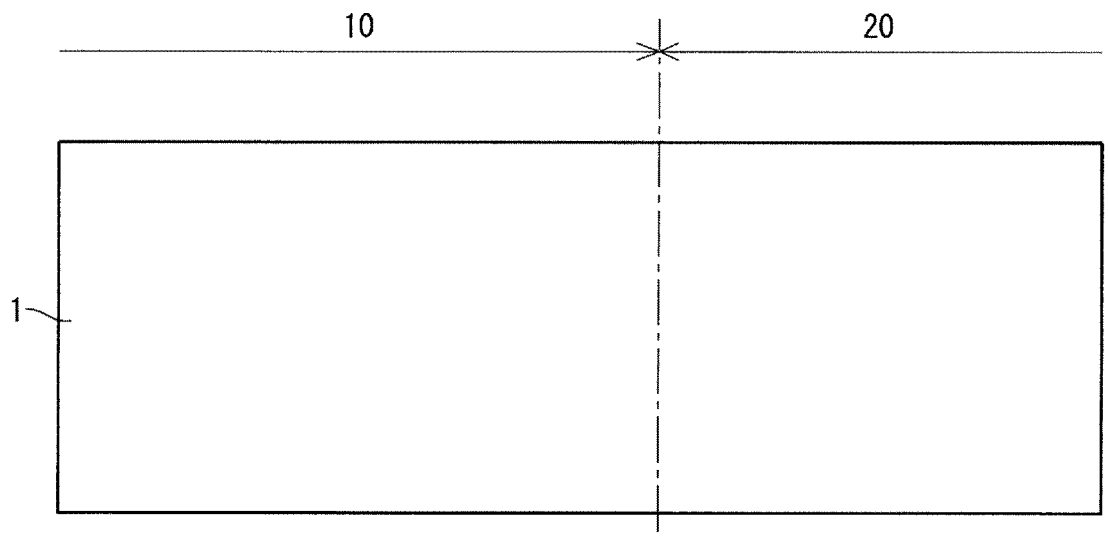
FIGS. 13A to 18B are each a sectional view illustrating a method for manufacturing the semiconductor device according to the first preferred embodiment.

First, as illustrated in FIG. 13A, a semiconductor substrate constituting the n⁻-type drift layer 1 is prepared. The semiconductor substrate may be, for example, an FZ wafer manufactured by a floating zone (FZ) method, an MCZ wafer manufactured by a magnetic field applied czochralki (MCZ) method, or an n-type wafer containing n-type impurities. The n-type impurities contained in the semiconductor substrate have a concentration that is appropriately selected depending on withstand voltage of the semiconductor device to be manufactured. For example, a semiconductor device with a withstand voltage of 1200V includes n-type impurities having a concentration that is adjusted so that the n⁻-type drift layer 1 constituting the semiconductor substrate has a specific resistance of about 40 to 120 Ω·cm. As illustrated in FIG. 13A, in the step of preparing a semiconductor substrate, the entire semiconductor substrate is the n⁻-type drift layer 1. When p-type or n-type impurity ions are injected into a semiconductor substrate as described above from the first main surface side or second main surface side and then are diffused in the semiconductor substrate by heat treatment or the like, a p-type or n-type semiconductor layer is appropriately formed, and the semiconductor device 100, 101 is manufactured.

As illustrated in FIG. 13A, the semiconductor substrate constituting the n⁻-type drift layer 1 includes a region to be the IGBT region 10 and the diode region 20. Although not illustrated, a region to be the terminal region 30 or the like is provided around the region to be the IGBT region 10 and the diode region 20. Hereinafter, although a method for manufacturing a structure of the IGBT region 10 and the diode region 20 of the semiconductor device 100, 101 will be mainly described, the terminal region 30 and the like of the semiconductor device 100, 101 may be manufactured by a well-known manufacturing method. For example, when an FLR having the p-type terminal well layer 31 as a withstand voltage holding structure is formed in the terminal region 30, p-type impurity ions may be injected to generate the FLR, before processing the IGBT region 10 and the diode region 20 of the semiconductor device 100, 101. Alternatively, when p-type impurity ions are injected into the IGBT region 10 or the diode region 20 of the semiconductor device 100, the p-type impurity ions may be simultaneously injected to form an FLR. The pad region 40 may be formed in the same manner as the IGBT region 10.

Figure 13B:
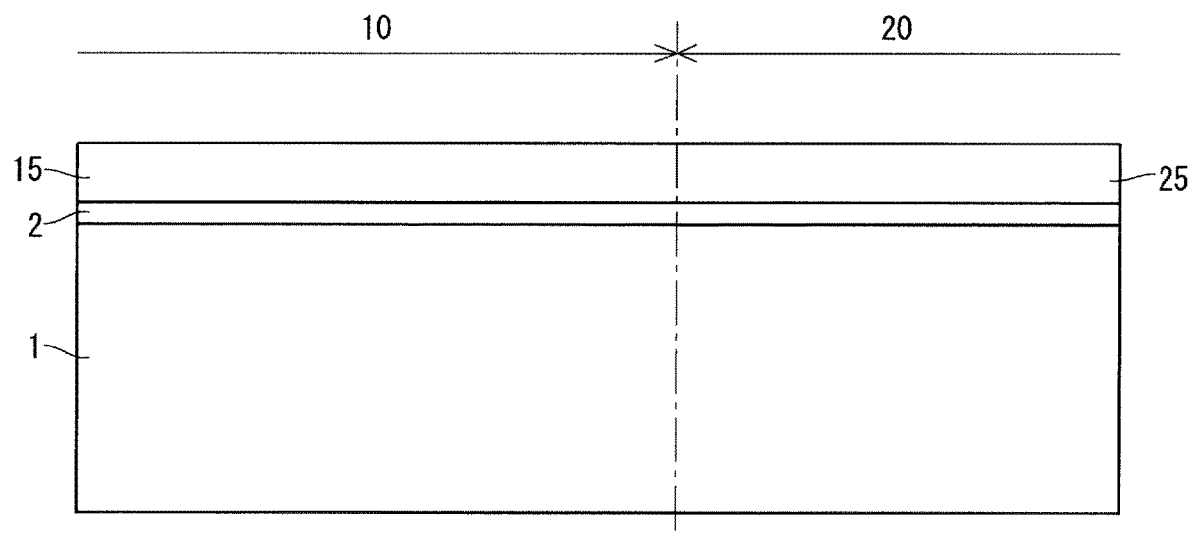

Next, as illustrated in FIG. 13B, n-type impurities such as phosphorus (P) are injected into the semiconductor substrate from the first main surface side to form the n-type carrier storage layer 2. Then, p-type impurities such as boron (B) are injected into the semiconductor substrate from the first main surface side to form the p-type base layer 15 and the p-type anode layer 25. The n-type carrier storage layer 2, the p-type base layer 15, and the p-type anode layer 25 are formed by injecting impurity ions into the semiconductor substrate and then diffusing the impurity ions by heat treatment. The n-type impurity ions and p-type impurity ions are injected after mask processing is applied on the first main surface of the semiconductor substrate. The mask processing is performed to form a mask on a semiconductor substrate for performing ions injection and etching in a predetermined region of the semiconductor substrate through an opening as follows: a resist is applied on a semiconductor substrate; and an opening is formed in a predetermined region of the resist using a photoengraving technique. The mask processing and injection of ions described above allow the n-type carrier storage layer 2, the p-type base layer 15, and the p-type anode layer 25 to be selectively formed in each the IGBT region 10 and the diode region 20 on the first main surface side. Similarly, the p-type terminal well layer 31 is selectively formed in the terminal region 30.

The p-type impurity ions of the p-type base layer 15 and those of the p-type anode layer 25 may be simultaneously injected. In this case, the p-type base layer 15 and the p-type anode layer 25 are identical in depth and concentration of the p-type impurities to each other. The p-type impurity ions of the p-type base layer 15 and those of the p-type anode layer 25 may be separately injected by mask processing to allow the p-type base layer 15 and the p-type anode layer 25 to be different in depth and concentration of the p-type impurities from each other.

The p-type impurity ions of the p-type terminal well layer 31 (not illustrated in FIG. 13B) and those of the p-type anode layer 25 may be simultaneously injected. In this case, the p-type terminal well layer 31 and the p-type anode layer 25 are identical in depth and concentration of the p-type impurities to each other. Alternatively, the p-type impurity ions of the p-type terminal well layer 31 and those of the p-type anode layer 25 may be separately injected by mask processing to allow the p-type terminal well layer 31 and the p-type anode layer 25 to be different in depth and concentration of the p-type impurities from each other. Alternatively, when the p-type impurity ions of the p-type terminal well layer 31 and those of the p-type anode layer 25 are simultaneously injected using masks having different aperture ratios, the p-type terminal well layer 31 and the p-type anode layer 25 also can be different in concentration of the p-type impurities from each other. In this case, a mesh-shaped mask may be used for one or both of the masks to allow the masks to be different in aperture ratio. Similarly, p-type impurity ions of each of the p-type terminal well layer 31, the p-type base layer 15, and the p-type anode layer 25 may be simultaneously injected using masks with different aperture ratios.

Figure 14A:
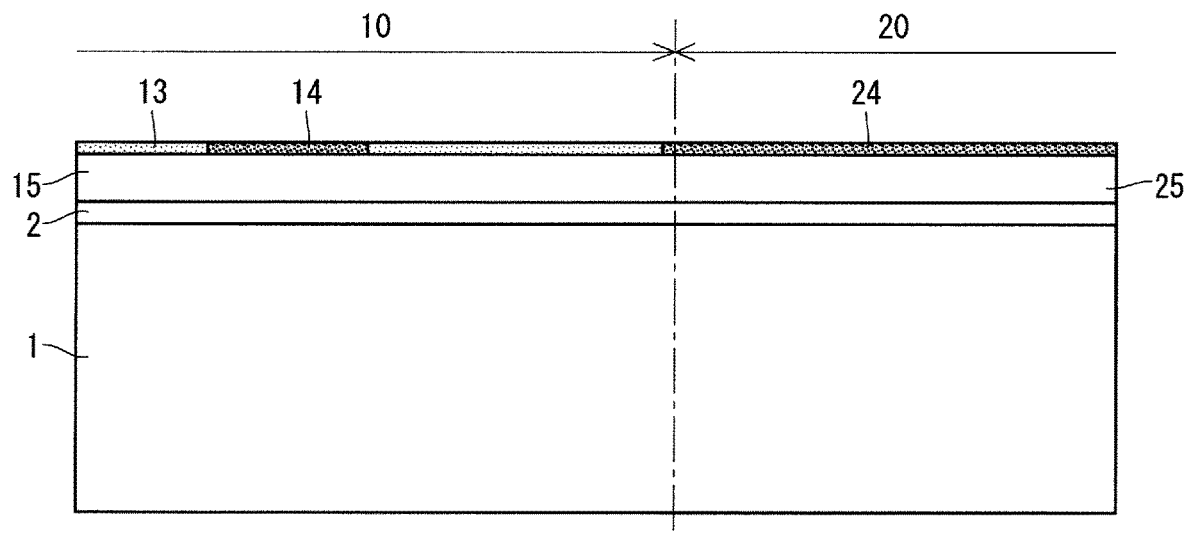

Next, as illustrated in FIG. 14A, the $n^+$-type source layer 13 is selectively formed on the a first main surface side of the p-type base layer 15 in the IGBT region 10 by the mask processing and injecting n-type impurities. The n-type impurities to be injected may be, for example, arsenic (As) or phosphorus (P). The mask processing and injection of p-type impurities allow the $p^+$-type contact layer 14 to be selectively formed on the first main surface side of the p-type base layer 15 in the IGBT region 10, and the $p^+$-type contact layer 24 to be selectively formed on the first main surface side of the p-type anode layer 25 in the diode region 20. The p-type impurities to be injected may be, for example, boron or aluminum.

Figure 14B:
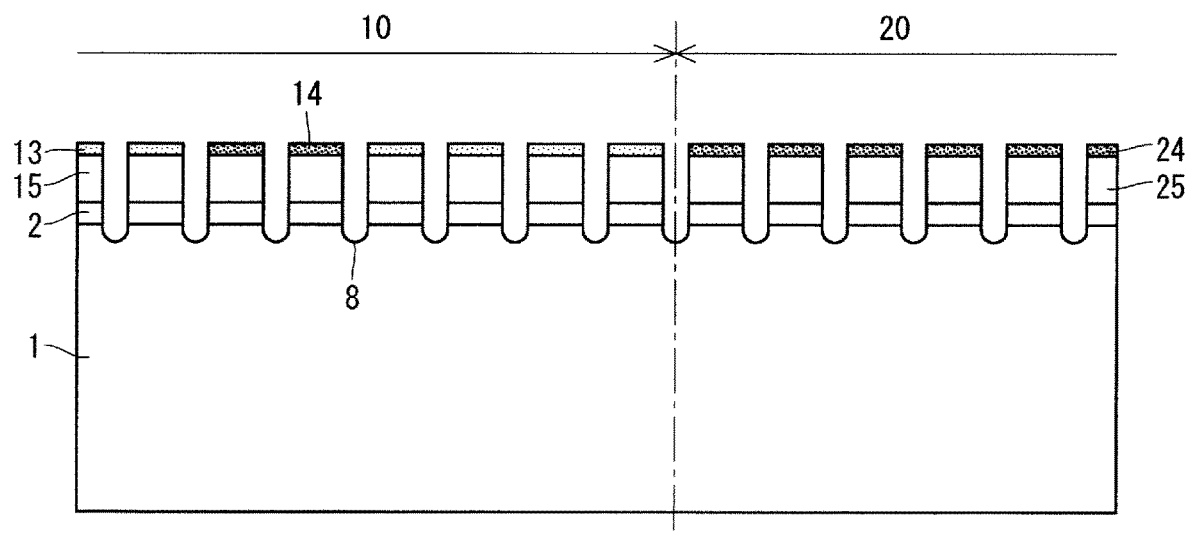

Next, as illustrated in FIG. 14B, a trench 8 is formed passing through the p-type base layer 15 or the p-type anode layer 25 from the first main surface side of the semiconductor substrate and reaching the $n^-$-type drift layer 1. In the IGBT region 10, the trench 8 passing through the $n^+$-type source layer 13 has a side wall including a part of the $n^+$-type source layer 13. In the IGBT region 10, the trench 8 passing through the $p^+$-type contact layer 14 has a side wall including a part of the $p^+$-type contact layer 14. In the diode region 20, the trench 8 passing through the p+-type contact layer 24 has a side wall including a part of the $p^+$-type contact layer 24.

For example, the trench 8 is formed as follows: after an oxide film such as $SiO_2$ is deposited on the semiconductor substrate, an opening is formed in a portion of the oxide film, where the trench 8 is to be formed, by the mask processing; and the semiconductor substrate is etched using the oxide film with the opening formed as a mask. Although in FIG. 14B, trenches 8 are formed at a pitch that is identical in the IGBT region 10 and the diode region 20, the pitch of the trenches 8 may be different between the IGBT region 10 and the diode region 20. The trenches 8 can be appropriately changed in pitch and pattern in plan view by changing a mask pattern used in the mask processing.

Figure 15A:
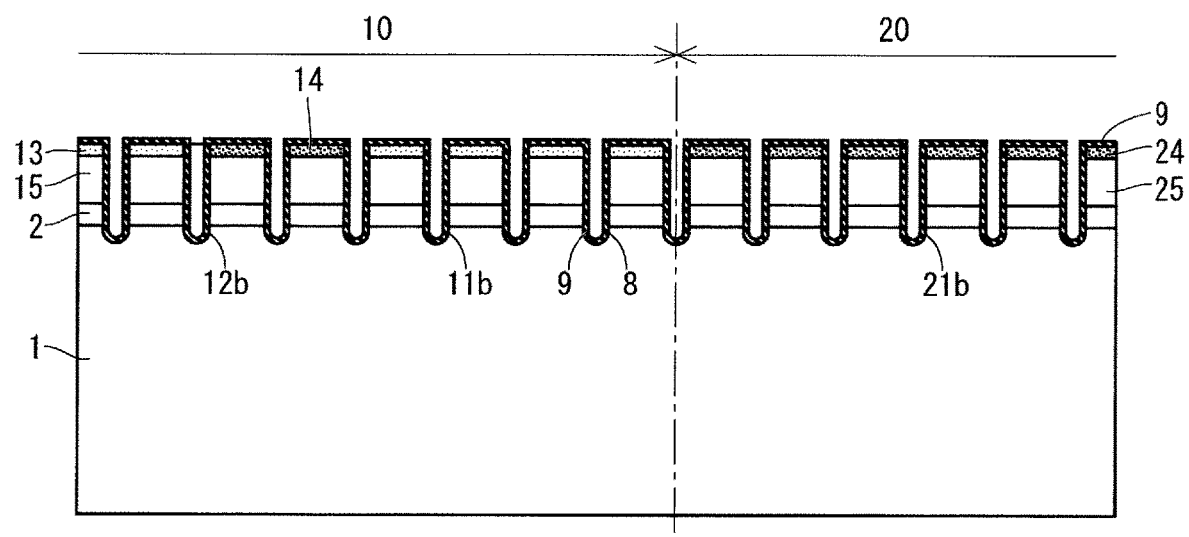

Next, as illustrated in FIG. 15A, the semiconductor substrate is heated in an atmosphere containing oxygen to form an oxide film 9 on an inner wall of the trench 8 and the first main surface of the semiconductor substrate. The oxide film 9 formed in the trench 8 in the IGBT region 10 serves as the corresponding one of the gate trench insulating film 11b of the active trench gate 11 and the dummy trench insulating film 12b of the dummy trench gate 12. The oxide film 9 formed in the trench 8 in the diode region 20 serves as the diode trench insulating film 21b. The oxide film 9 formed on the first main surface of the semiconductor substrate is removed in a later step except for a portion formed in the trench 8.

Figure 15B:
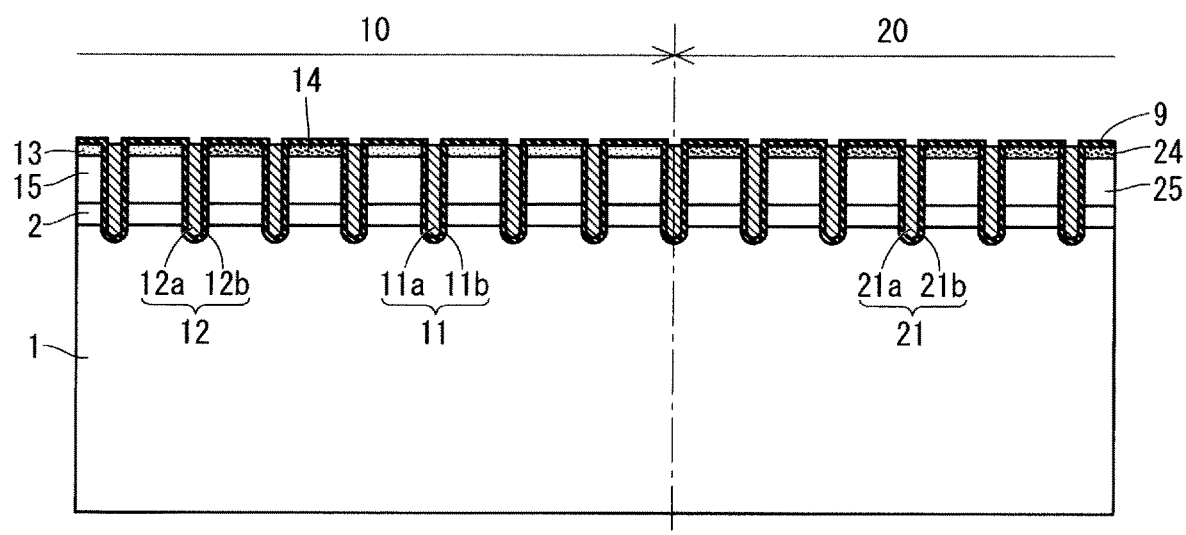

Next, as illustrated in FIG. 15B, polysilicon doped with n-type or p-type impurities is deposited on the oxide film 9 in the trench 8 by chemical vapor deposition (CVD) or the like to form the gate trench electrode 11a, the dummy trench electrode 12a, and the diode trench electrode 21a.

Subsequently, as illustrated in FIG. 16A, the interlayer insulating film 4 is formed on the gate trench electrode 11a of the active trench gate 11 in the IGBT region 10. The interlayer insulating film 4 may be, for example, $SiO_2$. When the mask processing is performed to form a contact hole in a deposited insulating film that becomes the interlayer insulating film 4, and remove the oxide film 9 formed on the first main surface of the semiconductor substrate, the interlayer insulating film 4 and the like in FIG. 16A are formed.

Contact holes of the interlayer insulating film 4 are formed on corresponding portions such as the n⁺-type source layer 13, the p⁺-type contact layer 14, the p⁺-type contact layer 24, the dummy trench electrode 12a, and the diode trench electrode 21a.

Subsequently, as illustrated in FIG. 16B, the barrier metal 5 is formed on the first main surface of the semiconductor substrate and the interlayer insulating film 4, and the emitter electrode 6 is further formed on the barrier metal 5. The barrier metal 5 is formed by depositing titanium nitride by physical vapor deposition (PDV) or CVD.

The emitter electrode 6 may be formed by depositing an aluminum-silicon alloy (Al—Si alloy) on the barrier metal 5 by, for example, PVD such as sputtering or vapor deposition. Then, a nickel alloy (Ni alloy) may be further formed on the formed aluminum-silicon alloy by electroless plating or electrolytic plating to form the emitter electrode 6. When the emitter electrode 6 is formed by plating, a thick metal film can be easily formed as the emitter electrode 6. This enables increasing heat capacity of the emitter electrode 6 to improve heat resistance thereof. When the emitter electrode 6 made of an aluminum-silicon alloy is formed by PVD and then a nickel alloy is further formed by a plating process, the plating process for forming the nickel alloy may be performed after the second main surface side of the semiconductor substrate is processed.

Subsequently, as illustrated in FIG. 17A, the second main surface side of the semiconductor substrate is ground to thin the semiconductor substrate to a designed predetermined thickness. The semiconductor substrate having been ground may have a thickness of 80 μm to 200 μm, for example.

Subsequently, as illustrated in FIG. 17B, n-type impurities are injected from the second main surface side of the semiconductor substrate to form the n-type buffer layer 3. Then, p-type impurities are injected from the second main surface side of the semiconductor substrate to form the p-type collector layer 16. The n-type buffer layer 3 may be formed in the IGBT region 10, the diode region 20, the terminal region 30, and the like, or may be formed only in the IGBT region 10 or the diode region 20. The n-type buffer layer 3 may be formed, for example, by injecting phosphorus (P) ions or protons (H⁺), or by injecting both protons and phosphorus. Protons can be injected deep from the second main surface of the semiconductor substrate with relatively low acceleration energy. Changing the acceleration energy enables protons to be relatively easily changed in depth of injection. Thus, when protons are injected multiple times to form the n-type buffer layer 3 while the acceleration energy is changed, the n-type buffer layer 3 can be formed thicker in a thickness direction of the semiconductor substrate than that formed from phosphorus.

In contrast, phosphorus can have a higher activation rate as n-type impurities than protons. Thus, when the n-type buffer layer 3 is formed from phosphorus, even a semiconductor substrate reduced in thickness can prevent punch-through of a depletion layer. To further thin the semiconductor substrate, both protons and phosphorus are preferably injected to form the n-type buffer layer 3. In this case, the protons are injected deeper from the second main surface than the phosphorus.

The p-type collector layer 16 may be formed by injecting boron (B), for example. The p-type collector layer 16 is also formed in the terminal region 30, and the p-type collector layer 16 in the terminal region 30 becomes the p-type terminal collector layer 16a. After boron ions are injected from the second main surface side of the semiconductor substrate, the second main surface is irradiated with a laser for laser annealing to activate the injected boron and from the p-type collector layer 16. At this time, phosphorus injected into a relatively shallow position from the second main surface of the semiconductor substrate is also activated simultaneously. Then, protons are activated at a relatively low annealing temperature of 380° C. to 420° C., so that temperature of the entire semiconductor substrate needs to be prevented from exceeding 380° C. to 420° C. after the protons are injected, except for the step of activating the protons. The laser annealing can raise temperature only near the second main surface of the semiconductor substrate, and thus can be used to activate n-type impurities or p-type impurities even after protons are injected.

Subsequently, as illustrated in FIG. 18A, the n⁺-type cathode layer 26 is formed on the second main surface side in the diode region 20. The n⁺-type cathode layer 26 may be formed by injecting phosphorus (P), for example. As illustrated in FIG. 18A, n-type impurities are selectively injected from the second main surface side by the mask processing so that a boundary between the p-type collector layer 16 and the n⁺-type cathode layer 26 is located away from a boundary between the IGBT region 10 and the diode region 20 toward the diode region 20 by a distance U1. The n-type impurities for forming the n⁺-type cathode layer 26 have an injection rate larger than an injection rate of the p-type impurities for forming the p-type collector layer 16. Although FIG. 18A illustrates the p-type collector layer 16 and the n⁺-type cathode layer 26 that have an equal depth from the second main surface, the n⁺-type cathode layer 26 may have a depth more than a depth of the p-type collector layer 16. The n⁺-type cathode layer 26 is formed in a region where an n-type semiconductor needs to be formed by injecting n-type impurities into a region where p-type impurities are injected, so that the n-type impurities have a concentration higher than a concentration of the p-type impurities injected into the entire region where the n⁺-type cathode layer 26 is formed.

Subsequently, as illustrated in FIG. 18B, the collector electrode 7 is formed on the second main surface of the semiconductor substrate. The collector electrode 7 is formed throughout the entire surface of the second main surface, including the IGBT region 10, the diode region 20, the terminal region 30, and the like. The collector electrode 7 may be formed throughout the entire surface of the second main surface of an n-type wafer that is a semiconductor substrate. The collector electrode 7 may be formed by depositing an aluminum silicon alloy (Ai—Si alloy), titanium (Ti), or the like by PVD such as sputtering or vapor deposition, and may be formed by layering multiple metals such as an aluminum silicon alloy, titanium, nickel or gold, and the like. The collector electrode 7 may be formed by further forming a metal film by electroless plating or electrolytic plating on a metal film formed by PVD.

The semiconductor device 100, 101 is manufactured by steps as described above. Multiple semiconductor devices 100, 101 are manufactured while being integrated in a matrix on a semiconductor substrate such as one n-type wafer. Thus, the semiconductor devices 100, 101 are individually separated by laser dicing or blade dicing.

<Summary of First Preferred Embodiment>

The semiconductor device according to the first preferred embodiment as described above allows Expression (2) above to satisfied for the first distance W in FIG. 12. Such a structure enables the first distance W to be reduced as much as possible while reducing an electron current flowing from the channel in the current sense region 41f into the $n^+$-type cathode layer 26 in the diode region 20. Thus, the semiconductor device can be reduced in size as much as possible.

Second Preferred Embodiment

FIG. 19 is a sectional view illustrating a structure near a pad region 40 of a semiconductor device according to a second preferred embodiment. Except that the structure near the pad region 40 according to the second preferred embodiment is different from the structure near the pad region 40 according to the first preferred embodiment, the structure of the semiconductor device according to the second preferred embodiment is identical to the structure of the semiconductor device according to the first preferred embodiment. Here, to avoid duplicated description, the contents described in the IGBT region 10 and the diode region 20, particularly the contents such as abbreviation and names of components, are appropriately eliminated.

The second preferred embodiment includes a current sense region 41f that is provided closer to a diode region 20 than to an IGBT region 10, and the current sense region 41f has a structure similar to that of the diode region 20.

Specifically, in the current sense region 41f, the n-type carrier storage layer 2 is provided on the first main surface side of the $n^-$-type drift layer 1, and the n-type buffer layer 3 is provided on the second main surface side of on the $n^-$-type drift layer 1.

The a first semiconductor layer is provided on the first main surface side of n-type carrier storage layer 2. The first semiconductor layer according to the second preferred embodiment corresponds to a p-type anode layer 25 in the diode region 20. The first semiconductor layer corresponding to the p-type anode layer 25 includes the first semiconductor layer that is substantially the same as the p-type anode layer 25. In the following description, the first semiconductor layer may be referred to as a "sense anode layer 45b". A $p^+$-type contact layer 24 is provided on the first main surface side of sense anode layer 45b.

As illustrated in FIG. 19, the current sense region 41f of the semiconductor device according to the second preferred embodiment is provided with a trench that passes through the sense anode layer 45b from the first main surface of the semiconductor substrate and reaches the $n^-$-type drift layer 1. The sense trench gate 42 is composed of a sense trench electrode 42a provided in a trench in the current sense region 41f via a sense trench insulating film 42b.

The sense trench insulating film 42b of the sense trench gate 42 is in contact with the sense anode layer 45b and the $p^+$-type contact layer 24. A channel is appropriately formed in the sense anode layer 45b in contact with the sense trench insulating film 42b of the sense trench gate 42.

A barrier metal 5 is provided on the first main surface of the semiconductor substrate. The barrier metal 5 is electrically connected to the sense trench electrode 42a. A current sense emitter electrode 17 is provided on the barrier metal 5, and the current sense emitter electrode 17 is insulated from the emitter electrode 6 by the interlayer insulating film 4 provided in the separation region 41g.

The semiconductor device according to the second preferred embodiment includes a second semiconductor layer that is provided on the second main surface side of on the n-type buffer layer 3 in the current sense region 41f. The second semiconductor layer according to the second preferred embodiment corresponds to an n+-type cathode layer 26 in the diode region 20. The second semiconductor layer corresponding to the $n^+$-type cathode layer 26 includes the second semiconductor layer that is substantially the same as the $n^+$-type cathode layer 26. In the following description, the second semiconductor layer may be referred to as a "sense cathode layer 46b". In the current sense region 41f of FIG. 19, the semiconductor substrate ranges from the $p^+$-type contact layer 24 to the sense cathode layer 46b. A collector electrode 7 is provided on the second main surface side of the sense cathode layer 46b.

Here, as illustrated in FIG. 19, a first distance from a channel of the sense anode layer 45b to a third semiconductor layer along an in-plane direction is defined as W. The third semiconductor layer according to the second preferred embodiment is a p-type collector layer 16 in the IGBT region 10. In the second preferred embodiment, the channel of the sense anode layer 45b is a portion of the sense anode layer 45b in contact with the sense trench insulating film 42b. Thus, the first distance W according to the second preferred embodiment is the same or substantially the same as the shortest distance from a portion where a boundary portion between the sense anode layer 45b and the n-type carrier storage layer 2 is in contact with the sense trench insulating film 42b to the p-type collector layer 16 in the IGBT region 10.

Subsequently, as illustrated in FIG. 19, a second distance from the channel of the sense anode layer 45b to the sense cathode layer 46b is defined as S. In the second preferred embodiment, the channel of the sense anode layer 45b is a portion of the sense anode layer 45b in contact with the sense trench insulating film 42b as described above. Thus, the second distance S according to the second preferred embodiment is the same or substantially the same as the shortest distance from the portion where the boundary portion between the sense anode layer 45b and the n-type carrier storage layer 2 is in contact with the sense trench insulating film 42b to the sense cathode layer 46b.

A lifetime and a diffusion coefficient of a portion of the semiconductor substrate between the channel of the sense anode layer 45b and the p-type collector layer 16 in the IGBT region 10 are defined as τ and D, respectively. The lifetime τ can be calculated by a lifetime measuring instrument. The lifetime τ is calculated by, for example, the μ-PCD method. The diffusion coefficient D can be acquired from the expression, D=μkTj/q. Here, μ is carrier mobility in a portion between the channel of the sense anode layer 45b and the p-type collector layer 16, k is the Boltzmann constant, Tj is a maximum rated temperature of an RC-IGBT being a semiconductor device, and q is an elementary charge.

Here, the second preferred embodiment allows Expression (2) above to be satisfied as in the first preferred embodiment. The second preferred embodiment as described above enables the first distance W to be reduced as much as possible while reducing a carrier current flowing from the channel in the current sense region 41f into the p-type collector layer 16 in the IGBT region 10. Thus, the semiconductor device can be reduced in size as much as possible. Expression (3) above may also be satisfied in the second preferred embodiment.

Third Preferred Embodiment

A third preferred embodiment has a first distance W larger than 486.3 μm when the first or second preferred embodiment has a second distance S smaller than 120 μm, a lifetime τ smaller than 30 μsec, and a maximum rated temperature Tj of 150° C. of the semiconductor device. That is, the third preferred embodiment uses the maximum rated temperature Tj instead of the diffusion coefficient D in consideration of D=μkTj/q. Even such a structure enables acquiring an effect similar to that of the first or second preferred embodiment.

Fourth Preferred Embodiment

A fourth preferred embodiment has a first distance W larger than 436.8 μm when the first or second preferred embodiment has a second distance S smaller than 60 μm, a lifetime τ smaller than 30 μsec, and a maximum rated temperature Tj of 125° C. of the semiconductor device. That is, the fourth preferred embodiment uses the maximum rated temperature Tj instead of the diffusion coefficient D as with the third preferred embodiment. Even such a structure enables acquiring an effect similar to that of the first or second preferred embodiment.

Fifth Preferred Embodiment

A fifth preferred embodiment has a first distance W larger than 550.9 μm when the first or second preferred embodiment has a second distance S smaller than 190 μm, a lifetime τ smaller than 30 μsec, and a maximum rated temperature Tj of 150° C. of the semiconductor device. That is, the fifth preferred embodiment uses the maximum rated temperature Tj instead of the diffusion coefficient D as with the third preferred embodiment. Even such a structure enables acquiring an effect similar to that of the first or second preferred embodiment.

Each of the preferred embodiments may be freely combined, or each of the preferred embodiments may be appropriately modified or eliminated.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate having a first main surface and a second main surface opposite to the first main surface, an IGBT region, a diode region, and a current sense region being provided along an in-plane direction in the semiconductor substrate,
   the semiconductor substrate including:
   a base layer provided on a first main surface side being a side of the first main surface, in the IGBT region;
   a collector layer provided on a second main surface side being a side of the second main surface, in the IGBT region;
   an anode layer provided on the first main surface side in the diode region;
   a cathode layer provided on the second main surface side in the diode region and adjacent to the collector layer in the in-plane direction;
   a first semiconductor layer provided on the first main surface side in the current sense region and corresponding to the base layer or the anode layer; and
   a second semiconductor layer provided on the second main surface side in the current sense region and corresponding to one of the collector layer and the cathode layer,
   wherein $$W > \sqrt{2S\sqrt{D\tau} + D\tau} \quad \text{[Expression 1]}$$

Expression 1 holds where a first distance along the in-plane direction from a channel of the first semiconductor layer to a third semiconductor layer that is an other of the collector layer and the cathode layer is designated as W, a second distance from the channel of the first semiconductor layer to the second semiconductor layer is designated as S, and a diffusion coefficient with respect to minority carriers of the channel of the first semiconductor layer and a lifetime of a part of the semiconductor substrate between the channel of the first semiconductor layer and the third semiconductor layer are designated as D and τ, respectively, and $$W < S + \sqrt{D\tau} \quad \text{[Expression 3]}$$

2. The semiconductor device according to claim 1, wherein
   the first distance is more than 486.3 μm when the second distance is less than 120 μm, the lifetime is less than 30 μsec, and the semiconductor device has a maximum rated temperature of 150° C.

3. The semiconductor device according to claim 1, wherein
   the first distance is more than 436.8 μm when the second distance is less than 60 μm, the lifetime is less than 30 μsec, and the semiconductor device has a maximum rated temperature of 125° C.

4. The semiconductor device according to claim 1, wherein
   the first distance is more than 550.9 μm when the second distance is less than 190 μm, the lifetime is less than 30 μsec, and the semiconductor device has a maximum rated temperature of 150° C.

* * * * *